US012156405B2

(12) United States Patent
Lee

(10) Patent No.: US 12,156,405 B2
(45) Date of Patent: Nov. 26, 2024

(54) THREE-DIMENSIONAL SEMICONDUCTOR DEVICE INCLUDING A CONNECTION PATTERN CONNECTING A SOURCE CHANNEL AND A VERTICAL CHANNEL

(71) Applicant: SK hynix Inc., Icheon-si (KR)

(72) Inventor: Nam Jae Lee, Icheon-si (KR)

(73) Assignee: SK hynix Inc., Icheon-si (KR)

( * ) Notice: Subject to any disclaimer, the term of this patent is extended or adjusted under 35 U.S.C. 154(b) by 321 days.

(21) Appl. No.: 17/192,262

(22) Filed: Mar. 4, 2021

(65) Prior Publication Data

US 2022/0068962 A1 Mar. 3, 2022

(30) Foreign Application Priority Data

Aug. 31, 2020 (KR) .................. 10-2020-0110556

(51) Int. Cl.
*H10B 43/27* (2023.01)
*H01L 23/522* (2006.01)
*H10B 41/27* (2023.01)

(52) U.S. Cl.
CPC ......... *H10B 43/27* (2023.02); *H01L 23/5226* (2013.01); *H10B 41/27* (2023.02)

(58) Field of Classification Search
CPC ...... H10B 43/27; H10B 41/27; H01L 23/5226
See application file for complete search history.

(56) References Cited

U.S. PATENT DOCUMENTS

| 8,278,695 | B2 | 10/2012 | Kidoh et al. | |
| 10,403,639 | B2 | 9/2019 | Orimoto et al. | |
| 2017/0352673 | A1* | 12/2017 | Lee | H01L 23/5226 |
| 2017/0358356 | A1* | 12/2017 | Lee | G11C 16/14 |
| 2017/0358362 | A1* | 12/2017 | Lee | H10B 41/35 |
| 2018/0286678 | A1* | 10/2018 | Lee | H01L 21/76831 |
| 2018/0342528 | A1* | 11/2018 | Lee | H10B 41/27 |
| 2019/0027492 | A1* | 1/2019 | Lee | H10B 43/10 |
| 2020/0203369 | A1* | 6/2020 | Lee | H10B 41/10 |
| 2020/0258817 | A1* | 8/2020 | Okina | H10B 43/40 |

* cited by examiner

*Primary Examiner* — Thao X Le
*Assistant Examiner* — Sean Ayers Winters
(74) *Attorney, Agent, or Firm* — WILLIAM PARK & ASSOCIATES LTD.

(57) ABSTRACT

There are provided a semiconductor memory device and a manufacturing method of the semiconductor including: a plurality of source channels penetrating a source select line; a gate stack structure overlapping with the source select line; a connection pattern disposed between the source select line and the gate stack structure, the connection pattern being commonly connected to the plurality of source channels; and a plurality of vertical channels penetrating the gate stack structure, the plurality of vertical channels being commonly connected to the connection pattern.

22 Claims, 29 Drawing Sheets

THREE-DIMENSIONAL SEMICONDUCTOR DEVICE INCLUDING A CONNECTION PATTERN CONNECTING A SOURCE CHANNEL AND A VERTICAL CHANNEL

CROSS-REFERENCE TO RELATED APPLICATION

The present application claims priority under 35 U.S.C. § 119(a) to Korean patent application number 10-2020-0110556 filed on Aug. 31, 2020, in the Korean Intellectual Property Office, the entire disclosure of which is incorporated by reference herein.

BACKGROUND

1. Technical Field

The present disclosure generally relates to a semiconductor memory device and a manufacturing method of the semiconductor memory device, and more particularly, to a three-dimensional semiconductor memory device and a manufacturing method of the three-dimensional semiconductor memory device.

2. Related Art

A semiconductor memory device includes memory cells capable of storing data. A three-dimensional semiconductor memory device includes three-dimensionally arranged memory cells so that an area that is occupied by memory cells per unit area of a substrate can be reduced.

SUMMARY

A semiconductor memory device according to an embodiment of the present disclosure may include: a plurality of source channels penetrating a source select line; a gate stack structure overlapping with the source select line; a connection pattern disposed between the source select line and the gate stack structure, the connection pattern being commonly connected to the plurality of source channels; and a plurality of vertical channels penetrating the gate stack structure, the plurality of vertical channels being commonly connected to the connection pattern.

A semiconductor memory device according to an embodiment of the present disclosure may include: a first source channel and a second source channel, extending in parallel to each other; a first source select line surrounding the first source channel; a second source select line surrounding the second source channel; a gate stack structure that overlaps with the first source select line, the gate stack structure extending to overlap with the second source select line; a first vertical channel penetrating a first region of the gate stack structure that overlaps with the first source select line; a second vertical channel penetrating a second region of the gate stack structure overlapping with the second source select line; a first connection pattern connecting the first source channel and the first vertical channel between the first source select line and the gate stack structure; a second connection pattern connecting the second source channel and the second vertical channel between the second source select line and the gate stack structure; and a source-side slit disposed between the first source select line and the second source select line, the source-side slit extending between the first connection pattern and the second connection pattern.

A semiconductor memory device according to an embodiment of the present disclosure may include: a plurality of source channels penetrating a source select line; a gate stack structure overlapping with the source select line; a plurality of vertical channels penetrating the gate stack structure; and a connection pattern disposed between the source select line and the gate stack structure to connect the plurality of vertical channels to the plurality of source channels, wherein a thickness of each vertical channel of the plurality of vertical channels is different from a thickness of each source channel of the plurality of source channels.

A method of manufacturing a semiconductor memory device according to an embodiment of the present disclosure may include: forming a preliminary gate stack structure with interlayer insulating layers and conductive patterns, which are alternately stacked on a first region of a sacrificial substrate, wherein the preliminary gate stack structure is penetrated by a memory layer and a plurality of vertical channels; forming a conductive layer that is connected to the plurality of vertical channels on the preliminary gate stack structure; forming a first insulating layer and a select gate layer on the conductive layer; and forming a source-side slit that penetrates the first insulating layer, the select gate layer, and the conductive layer such that the select gate layer is isolated into source select lines and the conductive layer is isolated into connection patterns.

BRIEF DESCRIPTION OF THE DRAWINGS

In the drawing figures, dimensions may be exaggerated for clarity of illustration. It will be understood that when an element is referred to as being "between" two elements, it can be the only element between the two elements, or one or more intervening elements may also be present. Like reference numerals refer to like elements throughout.

DETAILED DESCRIPTION

Specific structural or functional descriptions disclosed herein are merely illustrative for the purpose of describing embodiments according to the concept of the present disclosure. Embodiments according to the concept of the present disclosure can be implemented in various forms, and they should not be construed as being limited to the specific embodiments set forth herein.

Hereinafter, the terms 'first' and 'second' are used to distinguish one component from another component and are not meant to imply a specific number or order of components. The terms may be used to describe various components, but the components are not limited by the terms.

Further, it will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Figure 1:
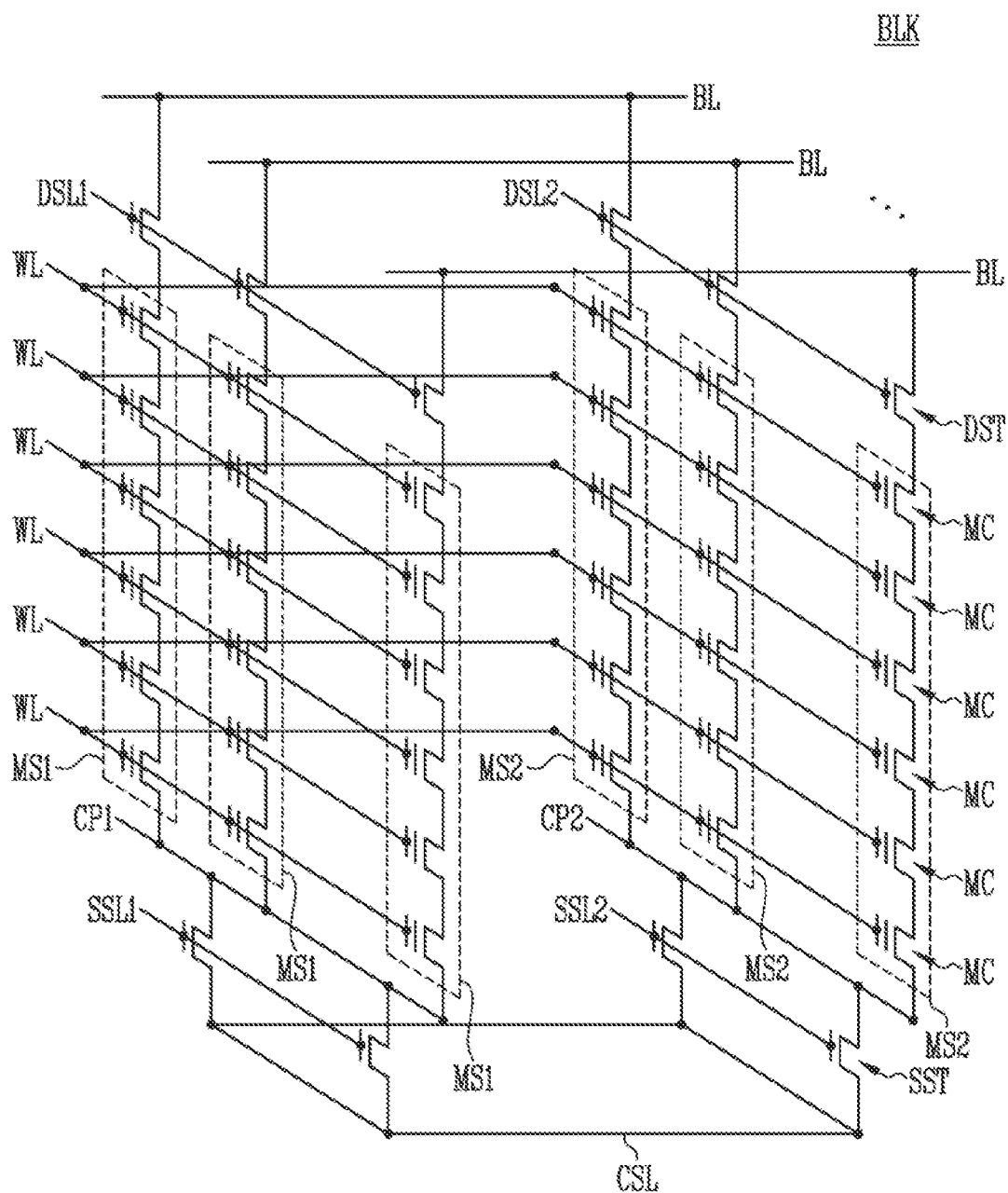
FIG. 1 is a circuit diagram illustrating a memory block of a semiconductor memory device in accordance with an embodiment of the present disclosure.

Embodiments provide a semiconductor memory device and a manufacturing method the semiconductor memory device, which may improve the stability of a manufacturing process of a three-dimensional semiconductor memory device and improve operational reliability of the three-dimensional semiconductor memory device, FIG. 1 is a circuit diagram illustrating a memory block BLK of a semiconductor memory device in accordance with an embodiment of the present disclosure.

Referring to FIG. 1, the semiconductor memory device may include a plurality of memory blocks BLK. Each memory block BLK may include a plurality of memory cell strings MS1 and MS2 that are connected to a commons source layer CSL and bit lines BL.

The plurality of memory cell strings MS1 and MS2 may be connected to the common source layer CSL through source select transistors SST. The plurality of memory cell strings MS1 and MS2 may be connected to the bit lines BL through drain select transistors DST. Each of the memory cell strings MS1 and MS2 may include a plurality of memory cells MC that are connected in series.

The gates of the source select transistors SST may be connected to source select lines SSL1 and SSL2 that are isolated from each other. The gates of the drain select transistors DST may be connected to drain select lines DSL1 and DSL2 that are isolated from each other. The gates of the plurality of memory cells MC may be connected to a plurality of word lines WL. The word lines WL may be disposed at different levels, and the gates of memory cells MC that are disposed at the same level may be connected to a single word line WL.

Hereinafter, the present disclosure will be mainly described based on an embodiment in which the memory block BLK includes first and second source select lines SSL1 and SSL2 that are isolated from each other and first and second drain select lines DSL1 and DSL2 that are isolated from each other. However, the present disclosure is not limited thereto, and the memory block BLK may include three or more source select lines that are isolated from each other and three or more drain select lines that are isolated from each other.

The plurality of memory cell strings MS1 and MS2 may be connected to each of the word lines WL. The plurality of memory cell strings MS1 and MS2 may include a first group and a second group, which may be individually selected by the first source select line SSL1 and the second source select line SSL2. The first group may include first memory cell strings MS1, and the second group may include second memory cell strings MS2.

The first memory cell strings MS1 may be respectively connected to the bit lines BL through the drain select transistors DST that are connected to the first drain select lines DSL1. The second memory cell strings MS2 may be respectively connected to the bit lines BL through the drain select transistors DST that are connected to the second drain select lines DSL2. In other words, a pair of first and second memory cell strings MS1 and MS2, among the first memory cell strings MS1 and the second memory cell strings MS2, may be connected to a bit line BL that corresponds the pair of first and second memory cell strings MS1 and MS2.

The first memory cell strings MS1 may be connected to the common source layer CSL through the source select transistors SST that is connected to the first source select line SSL1, and the second memory cell strings MS2 may be connected to the common source layer CSL through the source select transistors SST that is connected to the second source select line SSL2. Accordingly, the plurality of memory cell strings MS1 and MS2 may be simultaneously isolated into groups that may be individually selected for each of the source select lines SSL1 and SSL2 in a read operation or a verify operation. In an embodiment, in the read operation or the verify operation, one of the first source select line SSL1 and the second source select line SSL2 is selected so that one of the first group of the first memory cell strings MS1 and the second group of the second memory cell strings MS2 may be connected to the common source layer CSL, Accordingly, in the present disclosure, channel resistance may be reduced, compared to when the first memory cell strings MS1 and the second memory cell strings MS2 are simultaneously connected to the common source layer CSL in the read operation or the verify operation. Thus, in the present disclosure, read disturb may be reduced.

Figure 2:
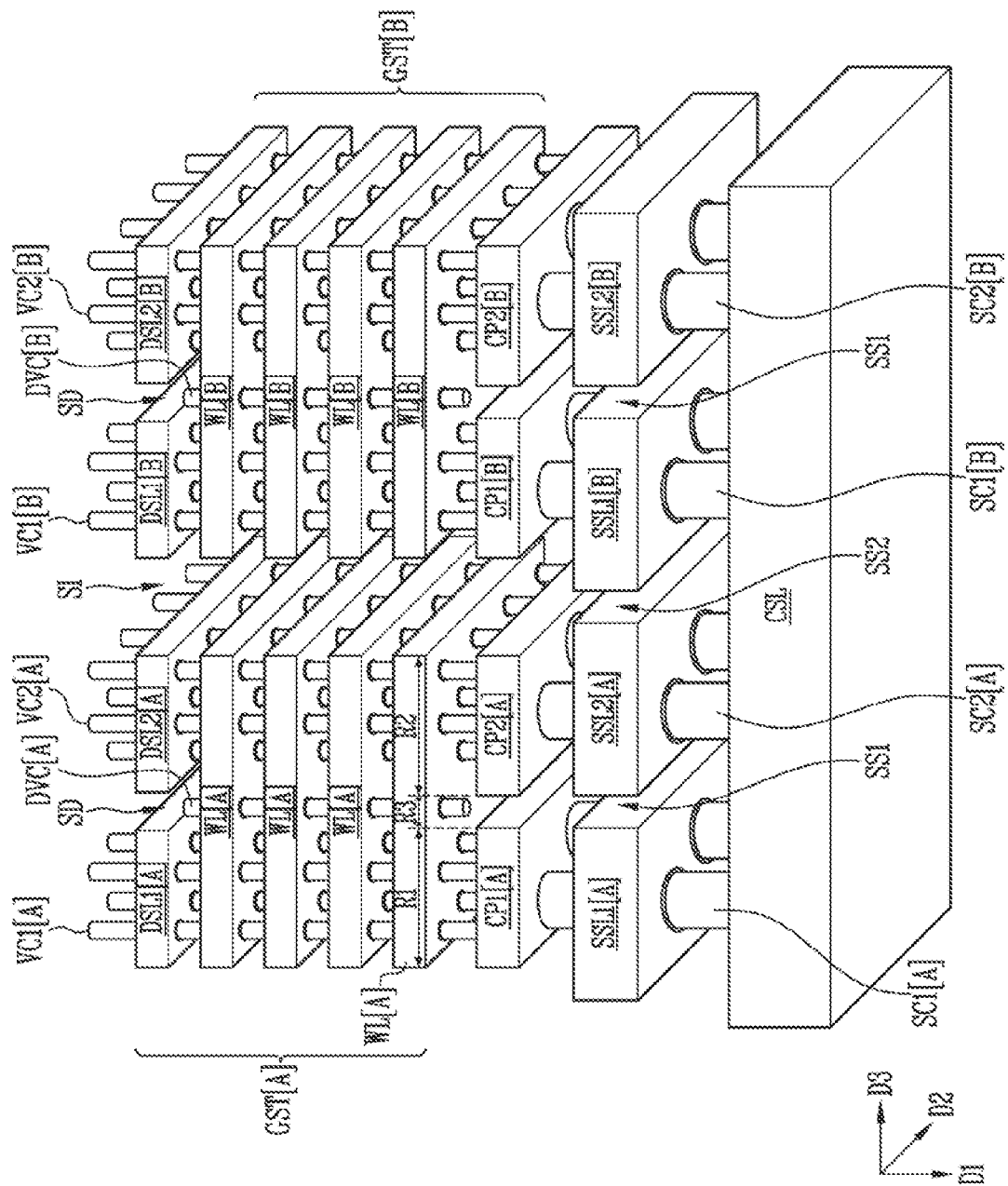
FIG. 2 is a perspective view schematically illustrating a semiconductor memory device in accordance with an embodiment of the present disclosure.

FIG. 2 is a perspective view schematically illustrating a semiconductor memory device in accordance with an embodiment of the present disclosure.

Referring to FIG. 2, the semiconductor memory device may include source select lines SSL1[A], SSL2[A], SSL1[B], and SSL2[B] that are isolated from each other by source-side slits SS1 and SS2, source channels SC1[A], SC2[A], SC1[B], and SC2[B] that penetrate the source select lines SSL1[A], SSL2[A], SSL1[B], and SSL2[B], connection patterns CP1[A], CP2[A], CP1[B], and CP2[B] that respectively overlap with the source select lines SSL1[A], SSL2[A], SSL1[B], and SSL2[B], vertical channels VC1[A], VC2[A], VC1[B], and VC2[B] in contact with the connection patterns CP1[A], CP2[A], CP1[B], and CP2[B], and gate stack structures GST[A] and GST[B] that surround the vertical channels VC1[A], VC2[A], VC1[B], and VC2[B].

The semiconductor memory device may include a first gate stack structure GST[A] and a second gate stack structure GST[B] that are isolated from each other by a slit SI.

The first gate stack structure GST[A] may include a plurality of word lines WL[A] and drain select lines that overlap with the plurality of word lines WL[A] and are isolated from each other by a drain-side slit SD.

In an embodiment, the first gate stack structure GST[A] may include the first drain select line DSL1[A] that overlaps with a first region R1 of the plurality of word lines WL[A] and second drain select lines DSL2[A] that overlaps with a second region R2 of the plurality of word lines WL[A]. The plurality of word lines WL[A] may include a third region R3. The third region R3 may be disposed between the first region R1 and the second region R2 and may connect the first region R1 and the second region R2 to each other. The drain-side slit SD may be disposed between the first drain select line DSL1[A] and the second drain select line DSL2[A] and may overlap with the third region R3 of the word line WL[A].

The first drain select line DSL1[A] and the first region R1 of the word line WL[A] may be penetrated by a plurality of first vertical channels VC1[A] that extend in a first direction D1. The second drain select line DSL2[A] and the second region R2 of the word line WL[A] may be penetrated by a plurality of second vertical channels VC2[A] that extend in the first direction D1.

Each of the word line WL[A], the first drain select line DSL1[A], and the second drain select line DSL2[A] may extend along a plane, intersecting the first direction D1, In an embodiment, each of the word line WL[A], the first drain select line DSL1[A], and the second drain select line DSL2[A] may extend in a second direction D2 and a third direction D3. The slit SI and the drain-side slit SD may extend in the second direction D2. The first drain select line DSL1[A] and the second drain select line DSL2[A] may be adjacent to each other in the third direction D3. The first direction D1, the second direction D2, and the third direction D3 may respectively correspond to directions in which an X-axis, a Y-axis, and a Z-axis face in an XYZ coordinate system.

The third region R3 of the word line WL[A] may be penetrated by a plurality of dummy channels DVC[A]. The dummy channels DVC[A] may be arranged in a line in the second direction D2. The drain-side slit SD may overlap with the dummy channels DVC[A]. In another embodiment, the dummy channels DVC[A] may be omitted. The distance that is defined between the first drain select line DSL1[A] and the second drain select line DSL2[A] in the third direction D3 may become narrower in the embodiment in which the dummy channels DVC[A] are omitted compared to the embodiment shown in FIG. 2.

Similarly to the first gate stack structure GST[A], the second gate stack structure GST[B] may include a plurality of word lines WL[B], and first drain select lines DSL1[B] and second drain select lines DSL2[B], which are isolated from each other by a drain-side slit SD. Also, similarly to the first gate stack structure GST[A], the second gate stack structure GST[B] may be penetrated by a plurality of first vertical channels VC1[B], a plurality of second vertical channels VC2[B], and a plurality of dummy channels DVC[B].

The first gate stack structure GST[A] and the second gate stack structure GST[B] may overlap with the source select lines SSL1[A], SSL2[A], SSL1[B], and SSL2[B]. The source select lines SSL1[A], SSL2[A], SSL1[B], and SSL2[B] may be isolated from each other at substantially the same level. The source select lines SSL1[A], SSL2[A], SSL1[B], and SSL2[B] may include a first source select line SSL1[A] and a second source select line SSL2[A] of a first group and a first source select line SSL2[A] and a second source select line SSL2[B] of a second group. The first source select line SSL1[A] and the second source select line SSL2[A] of the first group may be disposed between the first gate stack structure GST[A] and a common source layer CSL. The first source select line SSL2[A] and the second source select line SSL2[B] of the second group may be disposed between the second gate stack structure GST[B] and the common source layer CSL.

The plurality of word lines WL[A] of the first gate stack structure GST[A] may extend to overlap with the first source select line SSL1[A] and the second source select line SSL2[A] of the first group. The first region R1 of the word line WL[A] may overlap with the first source select line SSL1[A] of the first group, and the second region R2 of the word line WL[A] may overlap with the second source select line SSL2[A] of the first group. The first source select line SSL1[A] of the first group may be spaced apart from the second source select line SSL2[A] of the first group by a first source-side slit SS1 extending in the second direction D2.

Similarly to the first gate stack structure GST[A], the plurality of word lines WL[B] of the second gate stack structure GST[B] may overlap with the first source select line SSL1[B] and the second source select line SSL2[B] of the second group, which are spaced apart from each other. The first source select line SSL1[A] and the second source select line SSL2[A] of the first group may be spaced apart from the first source select line SSL1[B] and the second source select line SSL2[B] of the second group by a second source-side slit 552 extending in the second direction D2.

The source channels SC1[A], SC2[A], SC1[B], and SC2[B] may include source channels SC1[A] and SC2[A] of a first group and source channels SC1[B] and SC2[B] of a second group.

The source channels SC1[A] and SC2[A] of the first group may include a plurality of first source channels SC1[A] and a plurality of second source channels SC2[A]. The plurality of first source channels SC1[A] may be surrounded by the first source select line SSL1[A] of the first group. The plurality of second source channels SC2[A] may be surrounded by the second source select line SSL2[A] of the first group.

Similarly to the source channels SC1[A] and SC2[A] of the first group, the source channels SC1[B] and SC2[B] of the second group may include a plurality of first source channels SC1[B] surrounded by the first source select line SSL1[B] of the second group and a plurality of second source channels SC2[B] surrounded by the second source select line SSL2[B] of the second group.

The source channels SC1[A], SC2[A], SC1[B], and SC2[B] of the first group and the second group may extend in the first direction D1 to be commonly connected to the common source layer CSL.

The first and second source-side slits SS1 and SS2 may extend between the connection patterns CP1[A], CP2[A], CP1[B], and CP2[B]. The connection patterns CP1[A], CP2[A], CP1[B], and CP2[B] may be disposed at substantially the same level. The connection patterns CP1[A], CP2[A], CP1[B], and CP2[B] may include a first connection pattern CP1[A] and a second connection pattern CP2[A] of a first group and a first connection pattern CP1[B] and a second connection pattern CP2[B] of a second group.

The first connection pattern CP1[A] of the first group may be disposed between the first source select line SSL1[A] of the first group and the first gate stack structure GST[A]. The second connection pattern CP2[A] of the first group may be disposed between the second source select line SSL2[A] of the first group and the first gate stack structure GST[A]. The first connection pattern CP1[A] and the second connection pattern CP2[A] of the first group may extend in parallel to the first source select line SSL1[A] and the second source select line SSL2[A] of the first group.

The plurality of first source channels SC1[A] may extend to be in contact with the first connection pattern CP1[A]. The plurality of first vertical channels VC1[A] may be commonly connected to the first connection pattern CP1[A] and may be connected to the plurality of first source channels SC1[A] through the first connection pattern CP1[A]. The plurality of second source channels SC2[A] may extend to be in contact with the second connection pattern CP2[A]. The plurality of second vertical channels VC2[A] may be commonly connected to the second connection pattern CP2 [A] and may be connected to the plurality of second source channels SC2[A] through the second connection pattern CP2[A].

The first connection pattern CP1[B] and the second connection pattern CP2[B] of the second group may have a structure that is similar to that of the first connection pattern CP1[A] and the second connection pattern CP2[A] of the first group. The slit SI may extend between the first connection pattern CP1[A] and the second connection pattern CP2[A] of the first group and the first connection pattern CP1[B] and the second connection pattern CP2[B] of the second group, and the slit SI may be connected to the second source-side slit 552.

Figure 3A:
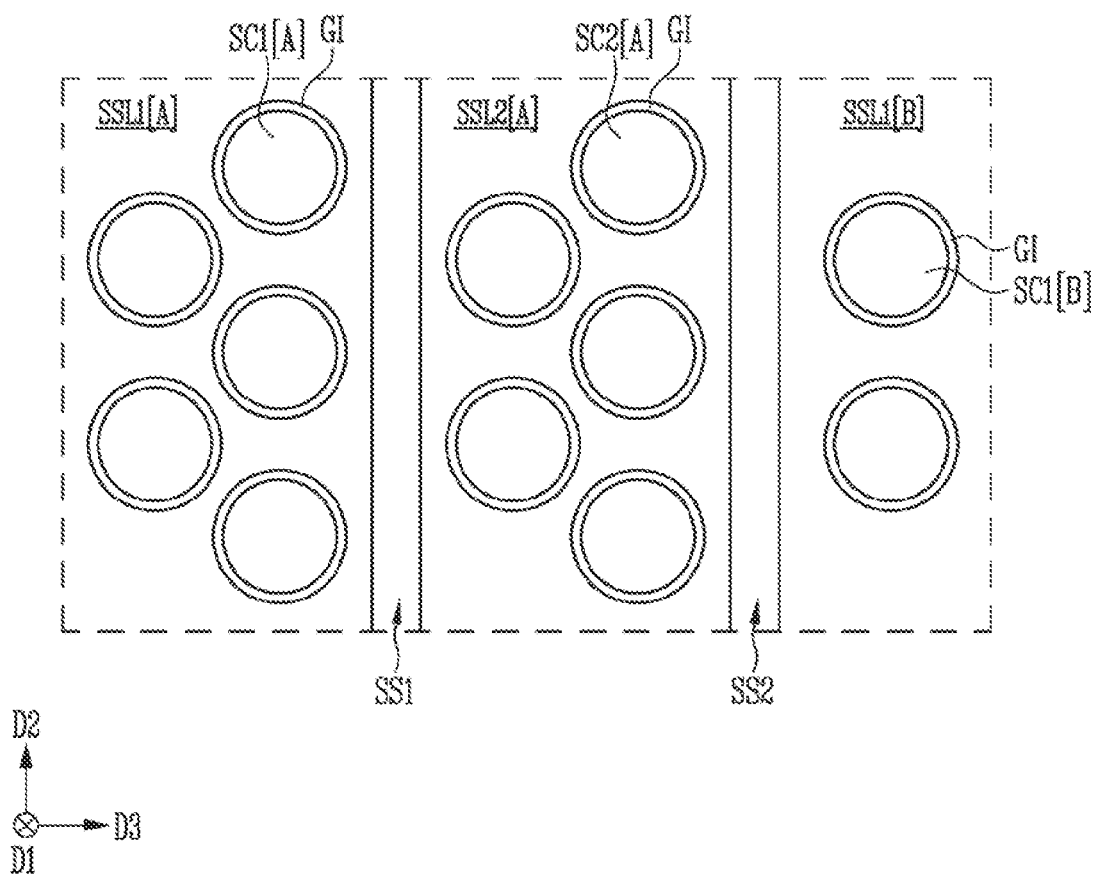
FIGS. 3A to 3C illustrate a layout of source select lines, gate stack structures, and bit lines of a semiconductor memory device in accordance with an embodiment of the present disclosure.
Figure 3B:
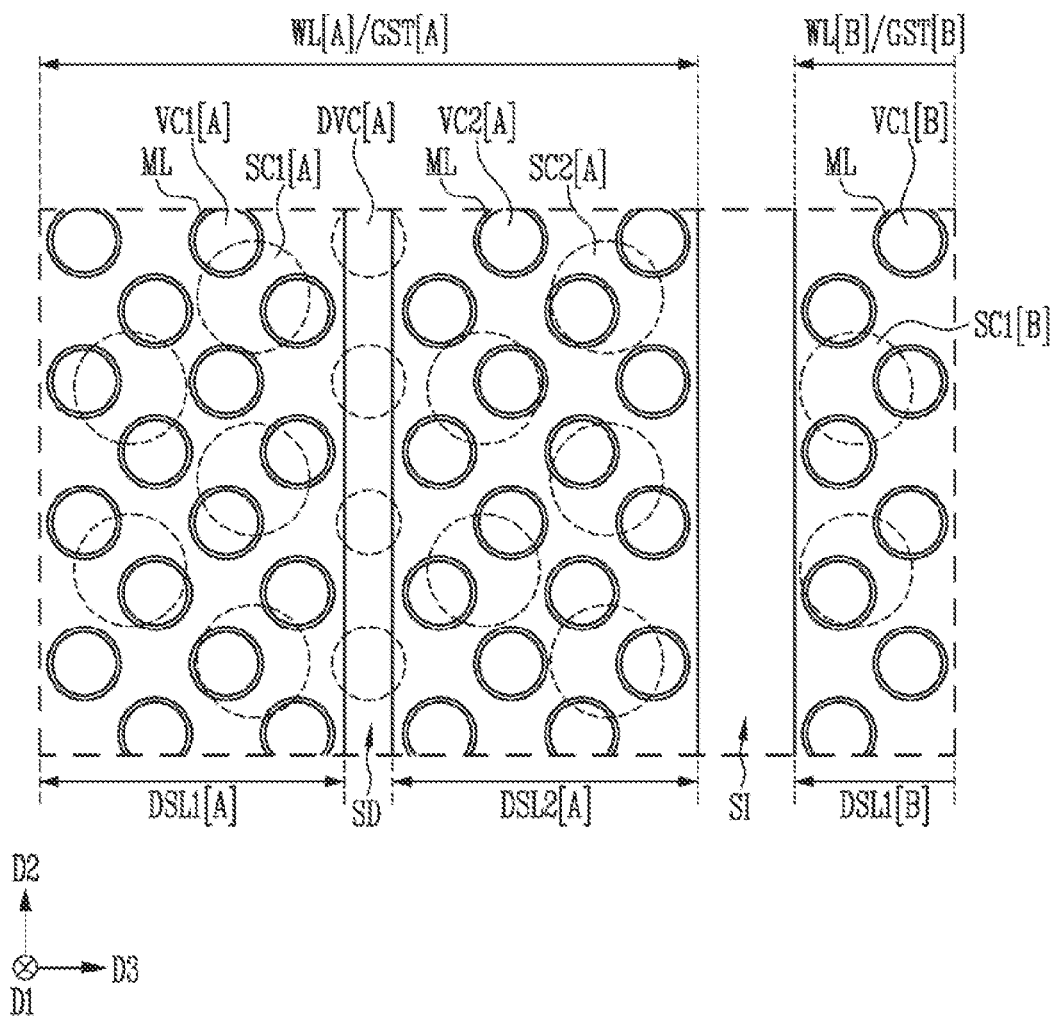
Figure 3C:
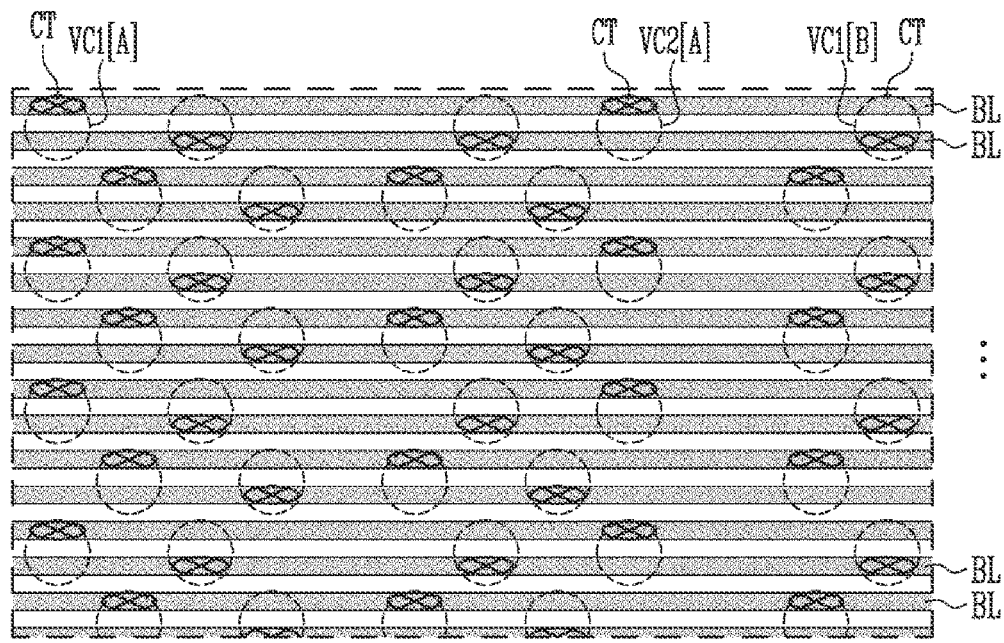
Figure 3C:
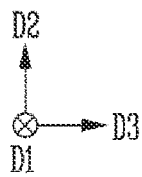

FIGS. 3A to 3C illustrate a layout of source select lines, gate stack structures, and bit lines of a semiconductor memory device in accordance with an embodiment of the present disclosure.

FIG. 3A is a plan view illustrating an embodiment of the first and second source select lines SSL1[A] and SSL2[A] of the first group and the first source select line SSL[B] of the second group.

Referring to FIG. 3A, the source select lines SSL1[A], SSL2[A], and SSL1[B] may respectively surround the source channels SC1[A], SC2[A], and SC1[B] that extend in the first direction D1, A sidewall of each of the source channels SC1[A], SC2[A], and SC1[B] may be surrounded by a gate insulating layer GI. In other words, the gate insulating layer GI may be disposed between each of the source select lines SSL1[A], SSL2[A], and SSL1[B] and each of the source channels SC1[A], SC2[A], and SC1[B].

The first source-side slit 551 and the second source-side slit SS2 may extend in the second direction D2. Each of the first source-side slit SS1 and the second source-side slit SS2 may have various shapes, such as a wave shape and a linear shape.

FIG. 3B is a plan view illustrating the first gate stack structure GST[A] that overlaps with the first and second source select lines SSL1[A] and SSL2[A] of the first group, shown in FIG. 3A, and the second gate stack structure GST[B] that overlaps with the first source select line SSL1[B] of the second group, shown in FIG. 3A.

Referring to FIG. 3B, the plurality of word lines WLA and the drain select lines DSL1[A] and DSL2[A] of the first gate stack structure GST[A] may be spaced apart from the plurality of word lines WL[B] and the drain select line DSL1[B] of the second gate stack structure GST[B] through the slit SI. The drain-side slit SD that overlaps with a word line (e.g., WL[A]) may overlap with dummy channels (e.g., DVC[A]).

Each of the slit SI and the drain-side slit SD may have various shapes such as a wave shape and a linear shape. In an embodiment, each of the slit SI and the drain-side slit SD may have a linear shape.

The word lines WL[A] and WL[B] and the drain select lines DSL1[A], DSL2[A], and DSL1[B] may surround the vertical channels VC1[A], VC2[A], and VC1[B]. The sidewall of each of the vertical channels VC1[A], VC2[A], and VC1[B] may be surrounded by a memory layer ML, In other words, the memory layer ML may be disposed between each of the word lines WL[A] and WL[B] and drain select lines DSL1[A], DSL2[A], and DSL1[B] and each of the vertical channels VC1[A], VC2[A], and VC1[B].

The area of a cross-section of each of the source channels SC1[A], SC2[A], and SC1[B] may be wider than that of a cross-section of each of the vertical channels VC1[A], VC2[A], and VC1[B]. The central axis of some of the vertical channels VC1[A], VC2[A], and VC1[B] might not overlap with that of the source channels SC1[A], SC2[A], and SC1[B], but may be dislocated from that of the source channels SC1[A], SC2[A], and SC1[B]. Some of the vertical channels VC1[A], VC2[A], and VC1[B] might not overlap with the source channels SC1[A], SC2[A], and SC1[B]. Two or more of the vertical channels VC1[A], VC2[A], and VC1[B] may overlap with some of the source channels SC1[A], SC2[A], and SC1[B].

The dummy channels DVC[A] might not overlap with the source channels SC1[A], SC2[A], and SC1[B]. The dummy channels DVC[A] may be arranged in a line along an extending direction of the drain-side slit SD.

FIG. 3C is a plan view illustrating bit lines BL overlapping with the vertical channels VC1[A], VC2[A], and VC1 [B] shown in FIG. 3B.

Referring to FIG. 3C, each of the bit lines BL may be connected to the vertical channels VC1[A], VC2[A], and VC1[B] that are described with reference to FIG. 38 through contact plugs CT. The vertical channels VC1[A], VC2[A], and VC1[B] that are connected to a single bit line may be individually controlled by different drain select lines DSL1 [A], DSL2[A], and DSL1[B], as shown in FIG. 33.

Figure 4A:
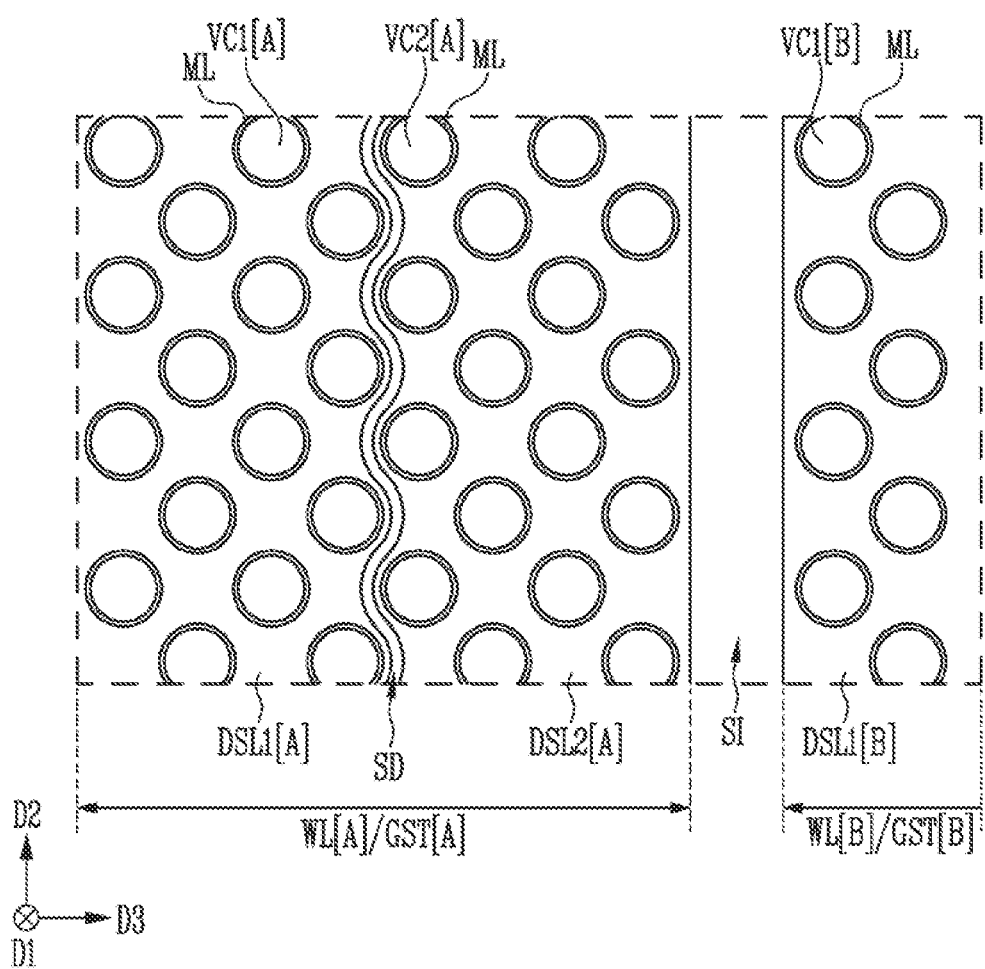
FIGS. 4A and 4B illustrate a layout of gate stack structures and bit lines of a semiconductor memory device in accordance with an embodiment of the present disclosure.
Figure 4B:
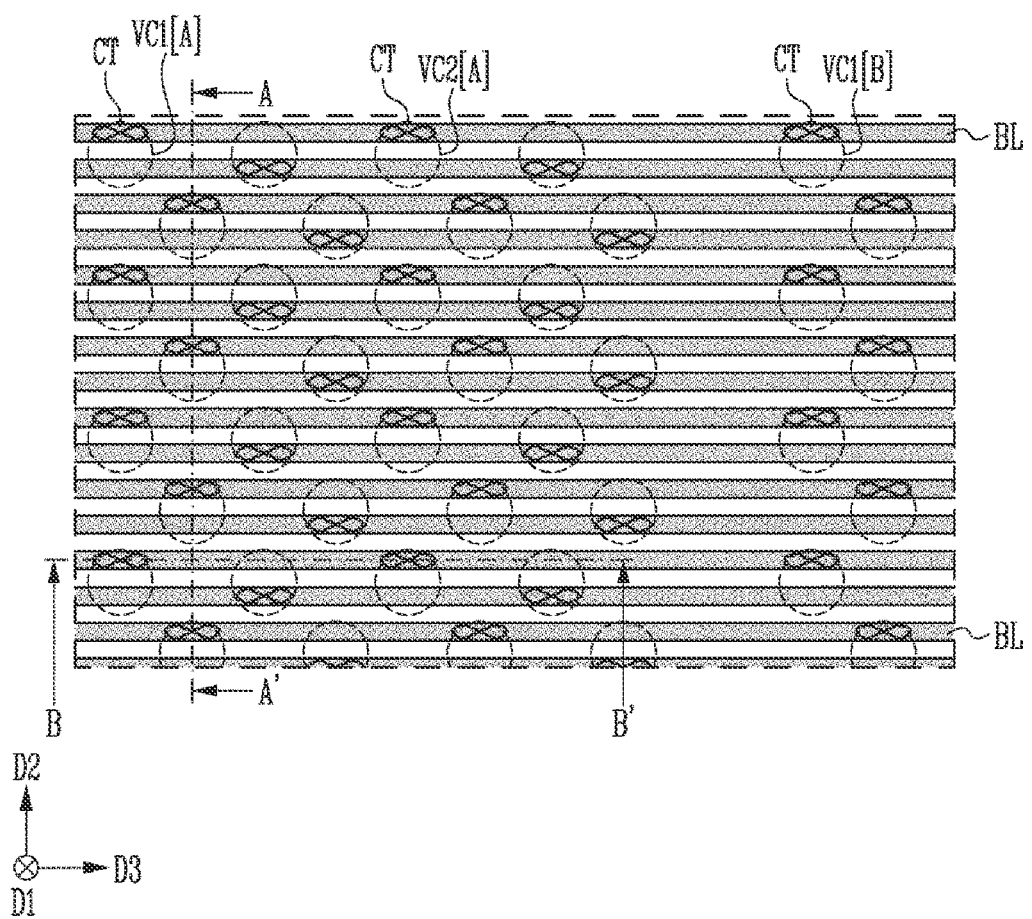

FIGS. 4A and 4B illustrate a layout of gate stack structures and bit lines of a semiconductor memory device in accordance with an embodiment of the present disclosure.

FIG. 4A is a plan view illustrating the first gate stack structure GST[A] and the second gate stack structure GST [B], FIG. 4A illustrates a layout of the plurality of word lines WL[A] and the drain select lines DSL1[A] and DSL2[A] of the first gate stack structure GST[A], and a plurality of word lines WL[B] and the drain select line DSL1[B] of the second gate stack structure GST[B].

Referring to FIG. 4A, the drain-side slit SD that overlaps with a plurality of word lines (e.g., WL[A]) may have a shape that is different from that of the slit SI between the first gate stack structure GST[A] and the second gate stack structure GST[B]. In an embodiment, the slit SI may extend in a linear shape in the second direction D2, and the drain-side slit SD may extend in a wave shape in the second direction D2.

The first gate stack structure GST[A] and the second gate stack structure GST[B] may be penetrated by the vertical channels VC1[A], VC2[A], and VC1[B] that are surrounded by the memory layers ML. The vertical channels VC1[A], VC2[A], and VC1[B] may be arranged in zigzag. The drain-side slit SD may have a wave-shaped sidewall that corresponds to a sidewall shape of vertical channels (e.g., VC1[A] and VC2[A]), adjacent to each other with the drain-side slit SD being interposed between the vertical channels (VC1[A] and VC2[A]).

FIG. 4B is a plan view illustrating bit lines BL overlapping with the vertical channels VC1[A], VC2[A], and VC1 [B] shown in FIG. 4A.

Referring to FIGS. 4B, each of the bit lines BL may be connected to the vertical channels VC1[A], VC2[A], and VC1[B] described with reference to FIG. 4A through contact plugs CT. The vertical channels VC1[A], VC2[A], and VC1[B] that are connected to a single bit line may be individually controlled by different drain select lines DSL1 [A], DSL2[A], and DSL1[B] as shown in FIG. 4A.

Figure 5A:
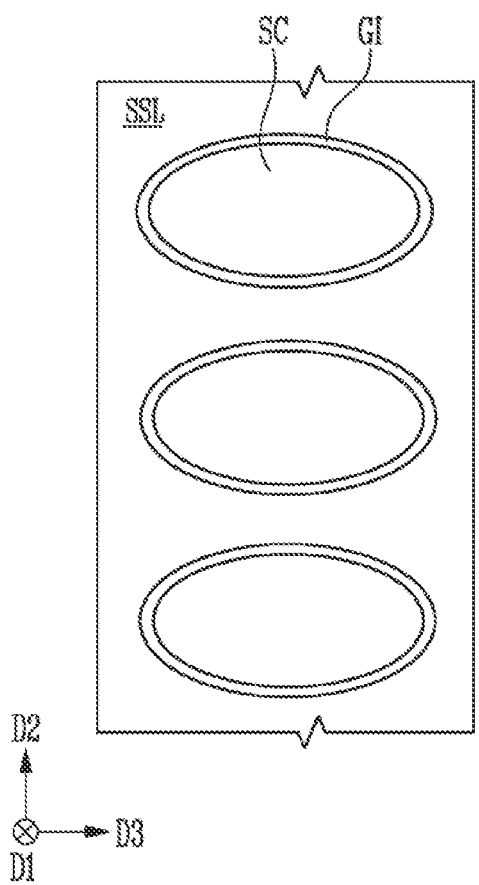
FIGS. 5A to 5C are plan views illustrating various embodiments of source channels.
Figure 5B:
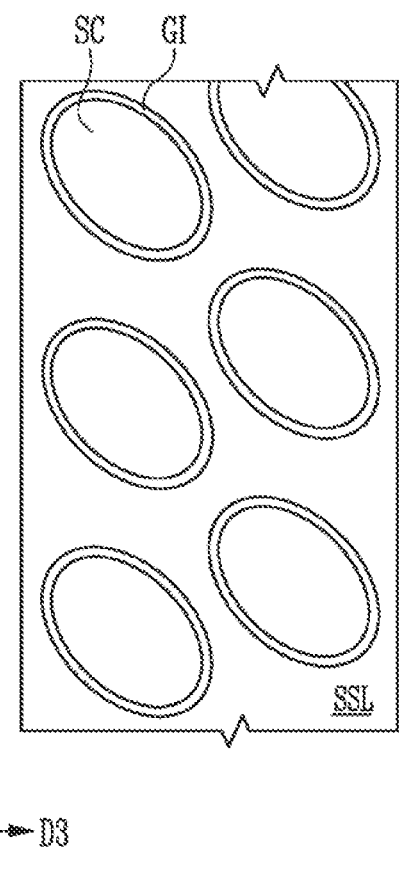
Figure 5C:
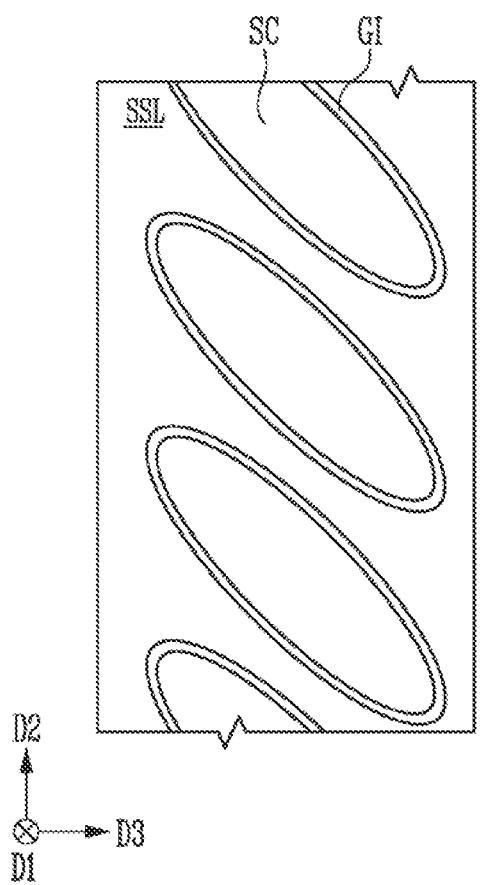

FIGS. 5A to 5C are plan views illustrating various embodiments of source channels CS.

Referring to FIGS. 5A to 5C, each of the source channels SC may be surrounded by a source select line SSL with a gate insulating layer GI interposed therebetween. The source channels SC may have various layouts.

Referring to FIGS. 5A to 5C, each of the source channels SC may extend in the first direction D1 and have an elliptical cross-sectional shape. The cross-sectional shape of each of the source channels SC is not limited to the elliptical shape and may have various shapes, such as a circular shape and a polygonal shape.

Referring to FIG. 5A, in an embodiment, the minor axis and the major axis of an elliptical shape may be respectively parallel to the axis that extends in the second direction D2 and the axis that extends in the third direction D1 Referring to FIGS. 53 and 5C, in another embodiment, the minor axis and the major axis of an elliptical shape may respectively face an oblique direction with respect to an axis that extends in the second direction D2 and an axis that extends in the third direction D3.

Referring to FIGS. 5A to 5C, the source channels SC may include a channel column that is arranged along the second direction D2. In an embodiment, as shown in FIGS. 5A and 5C, the source channels SC may include one channel column. In another embodiment, as shown in FIG. 5B, the source channels SC may include two channel columns. However, the present disclosure is not limited thereto, and the source channels SC may include three or more channel columns.

Figure 6A:
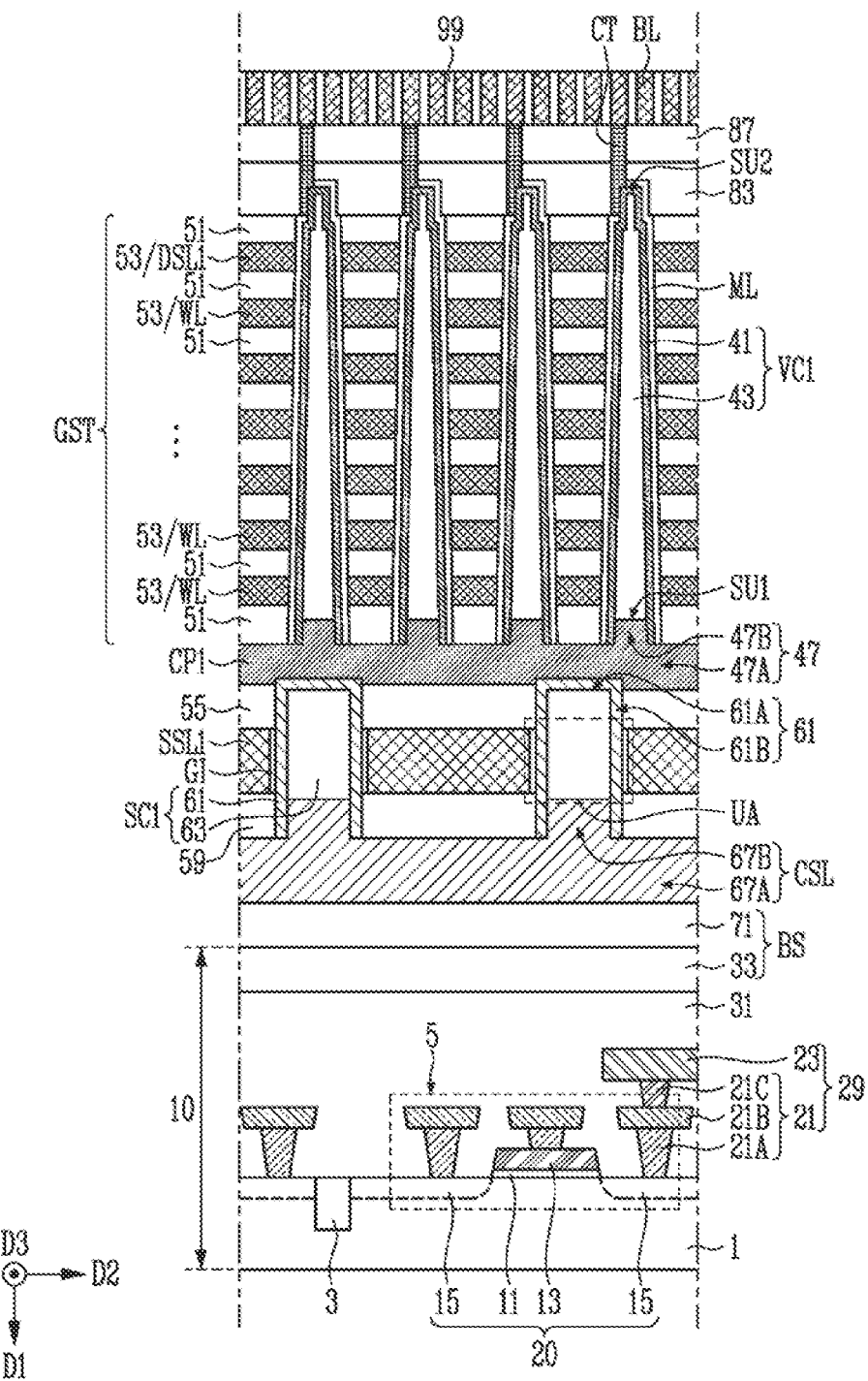
FIGS. 6A to 6C are sectional views illustrating a semiconductor memory device in accordance with an embodiment of the present disclosure.
Figure 6B:
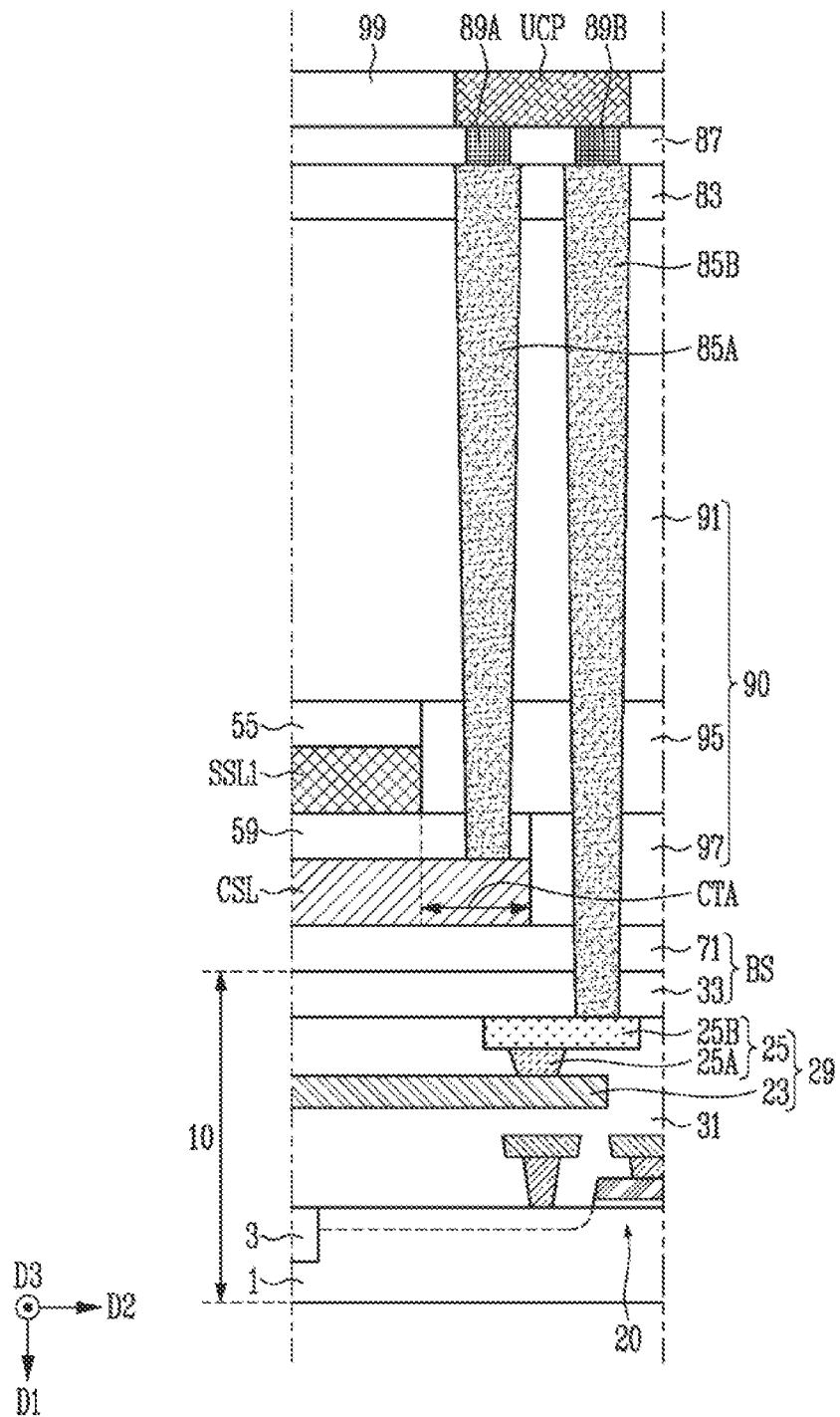
Figure 6C:
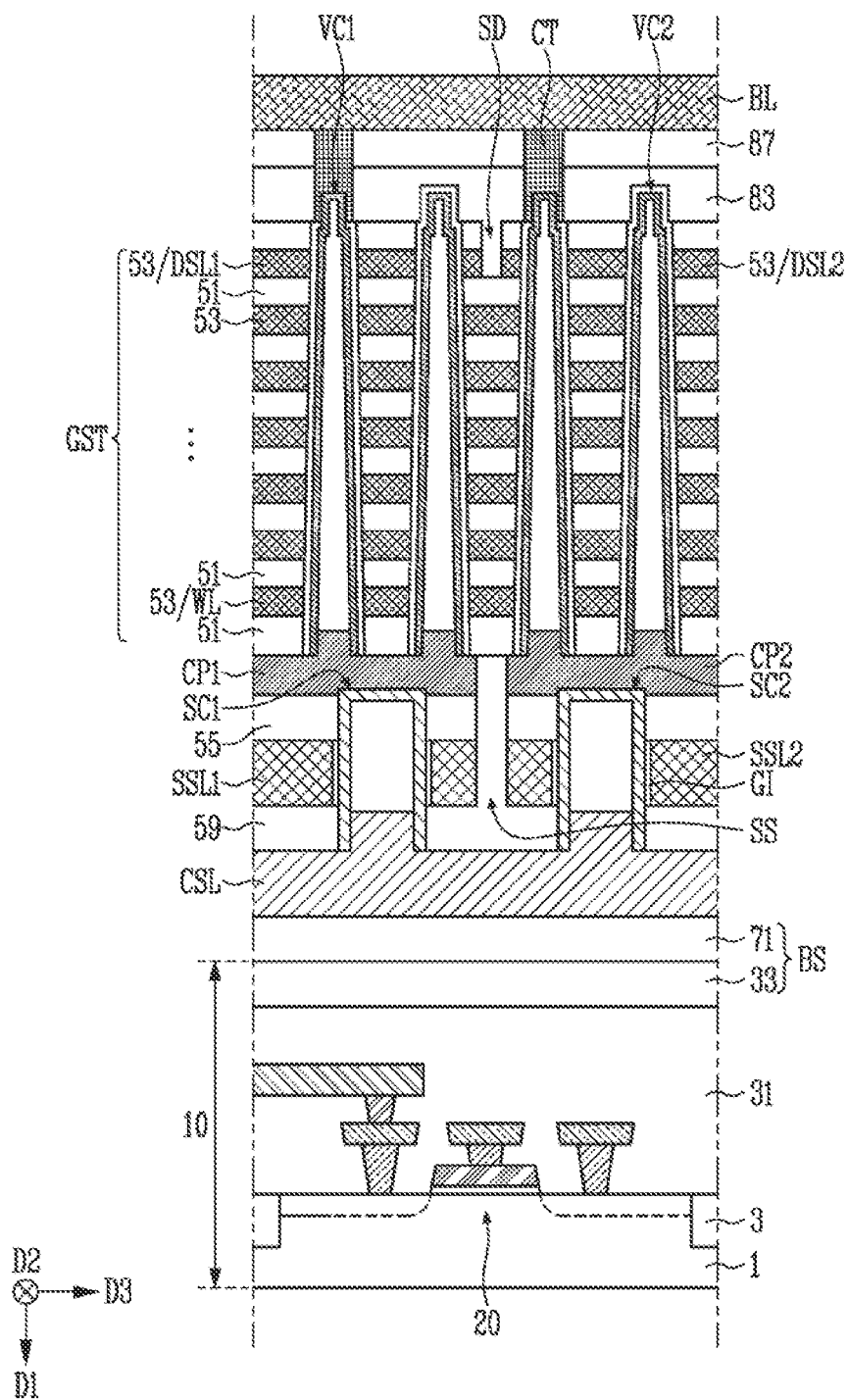

FIGS. 6A to 6C are sectional views illustrating a semiconductor memory device in accordance with an embodiment of the present disclosure. FIGS. 6A and 6C illustrate a cell array region of the semiconductor memory device, and FIG. 6B illustrates a connection region of the semiconductor memory device.

Referring to FIGS. 6A to 6C, the semiconductor memory device may include a peripheral circuit structure 10, a gate stack structure GST that overlaps with the peripheral circuit structure 10 and surrounds a plurality of vertical channels VC1 and VC2, a common source layer CSL that is disposed between the gate stack structure GST and the peripheral circuit structure GST, source select lines SSL1 and SSL2 that are disposed at substantially the same level between common source layer CSL and the gate stack structure GST to be spaced apart from each other, connection patterns CP1 and CP2 that are disposed at substantially the same level between the source select lines SSL1 and SSL2 and the gate stack structure GST to be spaced apart from each other, and bit lines BL that overlap with the connection patterns CP1 and CP2 with the gate stack structure GST interposed therebetween.

The gate stack structure GST may include interlayer insulating layers 51 and conductive patterns 53, which are alternately stacked in the first direction D1 in which the vertical channels VC1 and VC2 extend. The conductive patterns 53 may be formed of various conductive materials. The conductive patterns 53 may include drain select lines DSL1 and DSL2 that respectively overlap with the source select line SSL1 and SSL2 and word lines WL that are disposed to be spaced apart from each other between the drain select lines DSL1 and DSL2 and the source select line SSL1 and SSL2.

The gate stack structure GST may be penetrated by the vertical channels VC1 and VC2, Each of the vertical channels VC1 and VC2 may include a vertical core insulating layer 43 and a vertical channel layer 41, The vertical channel layer 41 may extend along a sidewall of the vertical core insulating layer 43 and may extend along the surface of the vertical core insulating layer 43 that faces the bit line BL. The vertical channel layer 41 may include a semiconductor layer that may be used as a channel of a memory cell string. In an embodiment, the vertical channel layer 41 may include silicon.

The sidewall of each of the vertical channels VC1 and VC2 may be surrounded by a memory layer ML. Partial regions of the memory layer ML may be used as data storage regions. The partial region of the memory layer ML may be defined at intersection portions of each of the vertical channels VC1 and VC2 and the word lines WL.

The bit lines BL may be formed of various conductive materials. The bit lines BL may be spaced apart from the gate stack structure GST. In an embodiment, the bit lines BL may be insulated from the gate stack structures GST by first and second upper insulating layers 83 and 87. The first and second upper insulating layers 83 and 37 may extend between the bit lines BL and the gate stack structure GST. The bit lines BL may be connected to the vertical channels VC1 and VC2 through contact plugs CT that are formed of a conductive material. Each of the contact plugs CT may penetrate the upper insulating layers 83 and 87 and the memory layer ML between the vertical channel layer 41 and the bit line BL and may be in contact with the vertical channel layer 41 and the bit line BL.

Each of the connection patterns CP1 and CP2 may include a doped semiconductor layer 47. In an embodiment, the doped semiconductor layer 47 may include a doped silicon layer. The doped semiconductor layer 47 may include a conductivity type impurity. In an embodiment, the doped semiconductor layer 47 may include an n-type impurity such as phosphorus. The doped semiconductor layer 47 may include a line part 47A that extends in parallel to each of the source select lines SSL1 and SSL2 and a protrusion part 47B that protrudes toward the vertical core insulating layer 43 from the lime part 47A. The protrusion part 476 of the doped semiconductor layer 47 may have a sidewall that is surrounded by the vertical channel layer 41.

The vertical channel layer 41 may protrude farther toward the line part 47A of the doped semiconductor layer 47 than the vertical core insulating layer 43 to surround the sidewall of the protrusion part 74B of the doped semiconductor layer 47, The vertical channel layer 41 may be in contact with the protrusion part 47B of the doped semiconductor layer 47, Because the protrusion part 47B includes a conductivity type dopant, the protrusion part 47B may have a specific resistivity lower than that of an undoped semiconductor layer. Because the vertical channel layer 41 is in contact with the protrusion part 47B with a low specific resistivity, the channel current in the vertical channel layer 41 may be improved.

The source select lines SSL1 and SSL2 may be formed of various conductive materials. The source select lines SSL and SSL2 may be spaced apart from the connection patterns CP1 and CP2 and the common source layer CSL. In an embodiment, the source select lines SSL and SSL2 may be insulated from the connection patterns CP1 and CP2 by a first insulating layer 55 and may be insulated from the common source layer CSL by a second insulating layer 59. The first insulating layer 55 may extend between the connection patterns CP1 and CP2 and the source select lines SSL1 and SSL2. The second insulating layer 59 may extend between the source select lines SSL1 and SSL2 and the common source layer CSL.

The first insulating layer 55, the source select lines SSL1 and SSL2, and the second insulating layer 59 may be penetrated by source channels SC1 and SC2. Each of the source channels SC1 and SC2 may include a source core insulating layer 63 and a source channel layer 61, The source channel layer 61 may extend along a sidewall of the source core insulating layer 63 and may extend along a surface of the source core insulating layer 63 that faces the connection patterns CP1 and CP2. The source channel layer 61 may include a semiconductor layer, which may be used as a channel of a source select transistor. In an embodiment, the source channel layer 61 may include silicon. The sidewall of each of the source channels SC1 and SC2, facing the source select lines SSL and SSL2, may be surrounded by a gate insulating layer GI.

The common source layer CSL may include a line part 67A that extends in parallel to the source select lines SSL1 and SSL2 and a protrusion part 67B that protrudes toward the source core insulating layer 63 from the line part 67A. The common source layer CSL may include a doped semiconductor layer. In an embodiment, the common source layer CSL may include a doped silicon layer. The doped semiconductor layer of the common source layer CSL may include a conductivity type impurity. In an embodiment, the doped semiconductor layer of the common source layer CSL may include an n-type impurity, such as phosphorus. The protrusion part 67B of the common source layer CSL may have a sidewall that is surrounded by the source channel layer 61.

The source channel layer 61 may protrude farther toward the line part 67A of the common source layer CSL than the source core insulating layer 63 to surround a sidewall of the protrusion part 676 of the common source layer CSL. The source channel layer 61 may be in contact with the protrusion part 67 of the common source layer CSL. Because the protrusion part 676 includes a conductivity type dopant, the protrusion part 676 may have a specific resistivity lower than that of an undoped semiconductor layer. Because the source channel layer 61 is in contact with the protrusion part 67B with a low specific resistivity, the channel current in the source channel layer 61 may be improved.

A first bonding insulating layer 71 may be disposed between the common source layer CSL and the peripheral circuit structure 10. The first bonding insulating layer 71 may protrude farther in the second direction D2 than each of the gate stack structure GST, the source select lines SSL1 and SSL2, and the common source line CSL as shown in FIG. 66. The space between the first upper insulating layer 83 and a portion of the first bonding insulating layer 71 that protrudes farther in the second direction D2 than the common source line CSL may be filled with a first insulating structure 90 as shown in FIG. 6B.

The peripheral circuit structure 10 may include a substrate 1 including a plurality of transistors 20, a second insulating structure 31 that covers the first substrate 1, a plurality of interconnection structures 29 that are buried in the second insulating structure 31, and a second bonding insulating layer 33 that covers the plurality of interconnection structures 29 and the second insulating structure 31. The interconnection structures 29 may be connected to the transistors 20 and may transmit electrical signals.

The substrate 1 may include a semiconductor substrate such as a silicon substrate or a germanium substrate. The first substrate 1 may include active regions that are partitioned by isolation layers 3. The transistors 20 may be disposed on the active regions. Each of the transistors 20 may include a gate insulating layer 11 and a gate electrode 13, which are stacked on the active regions of the substrate 1, and junctions 15 that are defined in the substrate 1 at both sides of the gate electrode 13. The junctions 15 may be defined when at least one of a p-type impurity and an n-type impurity is doped in the active region of the substrate 1.

The plurality of transistors 20 may be included in a peripheral circuit to control an operation of the semiconductor memory device. In an embodiment, at least one of the transistors 20 may be included in a source control circuit 5. The source control circuit 5 may be connected to the common source layer CSL by some of the interconnection structures 29 and may control the discharge of the common source layer CSL. In an embodiment, the interconnection structure 29 that is connected to the source control circuit 5 may include a lower contact structure 21, an interconnection line 23, and an upper contact structure 25. The lower contact structure 21 may be connected to the junction 15 of the source control circuit 5 as shown in FIG. 6A. The lower contact structure 21 may include patterns 21A, 21B, and 21C, which are sequentially stacked on the junction 15. The upper contact structure 25 may be disposed in the connection region. The interconnection line 23 may be in contact with the lower contact structure 21 shown in FIG. 6A and may extend to the connection region shown in FIG. 6B to be in contact with the upper contact structure 25. In other words, the lower contact structure 21 and the upper contact structure 25 may be connected to each other by the interconnection line 23.

The second insulating structure 31 may include multi-layered insulating layers, each including two or more layers.

The first bonding insulating layer 71 and the second bonding insulating layer 33 may be bonded to each other, forming a bonding structure BS.

FIG. 6A is a sectional view of the semiconductor memory device taken along a line intersecting the bit lines BL and corresponds to the sectional view taken along line A-A' shown in FIG. 4B.

Referring to FIG. 6A, the source channels SC1 may be connected to the connection pattern CP1 with a lower density than that of the vertical channels VC1 in the same area. In an embodiment, the number of the source channels SC1 that are connected to the connection pattern CP1 may be smaller than that of the vertical channels VC1 that are connected to the connection pattern CP1.

The source channel layer 61 may include a semiconductor layer with a contact pattern 61A and a pillar part 61B. The contact pattern 61A may be connected to the connection pattern CP1. The pillar part 61B may extend in the first direction D1 toward the common source layer CSL from an edge of the contact pattern 61A, The side all of the source core insulating layer 63 may be surrounded by the pillar part 61B of the source channel layer 61 between the contact pattern 61A and the common source layer CSL. The pillar part 61B of the source channel layer 61 may extend to surround the protrusion part 67B of the common source layer CSL.

The impurity of the doped semiconductor layer 47 may be diffused into the contact pattern 61A, and the impurity of the common source layer CSL may be diffused into a portion of the pillar part 61B in contact with the protrusion part 67B of the common source layer CSL. The pillar part 61B may include an undoped region UA. The undoped region UA of the pillar part 61B may be defined as a region in which the impurity of the doped semiconductor layer 47 and the impurity of the common source layer CSL do not diffuse. More specifically, a partial region of the pillar part 61B may remain as the undoped region UA at a level between the connection pattern CP1 and the common source layer CSL. In an embodiment, the undoped region UA of the pillar part 61B may remain at a level at which the source select line SSL1 is disposed. Off-characteristics of the source select transistor that is connected to the source select line SSL1 may be improved by the undoped region UA of the pillar part 61B.

The vertical core insulating layer 43 may include a first surface SU1 and a second surface SU2, which face in directions that are opposite to each other. The first surface SU1 may face the connection pattern CP1, and the second surface SU2 may face the bit line BL. The vertical channel layer 41 may extend along the second surface SU2 of the vertical core insulating layer 43 and may extend between the vertical core insulating layer 43 and the gate stack structure GST.

The bit lines BL may be arranged in the second direction D2 at a pitch that is narrower than that of the vertical channels VC1. The bit lines BL may penetrate a third upper insulating layer 99 and may be in contact with the contact plugs CT.

FIG. 6B illustrates end portions of the common source layer CSL and the source select line SSL, which are shown in FIG. 6A. FIG. 6B is a sectional view of the common source layer CSL and the source select line SSL1, which are taken along a line that is parallel to the second direction D2.

Referring to FIG. 6B, the common source line CSL and the source select line SSL1 may extend in the second direction D2. The end portion of the source select line Sal and the end portion of the common source layer CSL may form a step structure. More specifically, the common source layer CSL may include a contact region CIA protruding farther toward the second direction D2 than the source select line SSL1.

The common source layer CSL may be connected to the interconnection structure 29 through a first vertical contact plug 85A, an upper conductive pattern UCP, and a second vertical contact plug 85B. The first vertical contact plug 85A may be in contact with the contact region CTA of the common source layer CSL, and the second vertical contact plug 85B may be in contact with the interconnection structure 29. The upper conductive pattern UCP may connect the first vertical contact plug 85A and the second vertical contact plug 85B to each other.

The first vertical contact plug 85A and the second vertical contact plug 85B may extend in parallel to each other to penetrate the first insulating structure 90 and the first upper insulating layer 83 and may be formed of various conductive materials. The first insulating structure 90 may include multi-layered insulating layers. In an embodiment, the first insulating structure 90 may include a first filling insulating layer 91, a second filling insulating layer 95, and a third filling insulating layer 97, The first filling insulating layer 91 may be disposed at the same level as the gate stack structure GST as shown in FIG. 6A and may extend to a level at which the line part 47A of the doped semiconductor layer 47 is disposed. The second filling insulating layer 95 may be disposed at the same level as a stack structure of the source select line SSL1 and the first insulating layer 55. The third filling insulating layer 97 may be disposed at the same level as a stack structure of the second insulating layer 59 and the common source layer CSL.

The first vertical contact plug 85A may extend in the first direction D1 to penetrate the first upper insulating layer 83, the first filling insulating layer 91, the second filling insulating layer 95, and the second insulating layer 59, The first vertical contact plug 85A may include a surface in contact with the contact region CTA of the common source layer CSL.

The second vertical contact plug 85B may extend in the first direction D1 to penetrate the first upper insulating layer 83, the first filling insulating layer 91, the second filling insulating layer 95, the third filling insulating layer 97, and the bonding structure BS. The second vertical contact plug 85B may include a surface in contact with the upper contact structure 25 of the interconnection structure 29. The upper contact structure 25 may be a portion of the interconnection structure 29 that is connected to the source control circuit 5 as shown in FIG. 6A. The upper contact structure 25 may include a via plug that is in contact with the interconnection line 23 and a pad pattern 25B that is disposed between the via plug 25A and the second vertical contact plug 85B.

The upper conductive pattern UCP may be connected to the first and second vertical contact plugs 85A and 85B through first and second via plugs 89A and 89B. The first and second via plugs 89A and 89B may be formed of the same conductive material as the contact plugs CT as shown in FIG. 6A. The first and second via plugs 89A and 89B may penetrate the second upper insulating layer 87 and may be respectively in contact with the first and second vertical contact plugs 85A and 85B. The upper conductive pattern UCP may penetrate the third insulating layer 99 and may extend toward the second via plug 89B from the first via plug 89A.

FIG. 6C is a sectional view of the semiconductor memory device taken along a line parallel to the bit line BL. FIG. 6C corresponds to the sectional view taken along line B-B' shown in FIG. 4B.

Referring to FIG. 6C, the source channels SC1 and SC2 may include a first source channel SC1 and a second source channel SC2, which extend in parallel to each other.

The source select lines SSL1 and SSL2 may include a first source select line SSL1 and a second source select line SSL2, which are isolated from each other by a source-side slit SS. The first source select line SSL1 may surround a sidewall of the first source channel SC1, and the second source select line SSL2 may surround a sidewall of the second source channel SC2.

The vertical channels VC1 and VC2 may include a first vertical channel VC1 and a second vertical channel VC2. The first vertical channel VC1 may overlap with the first source select line SSL1. The second vertical channel VC2 may overlap with the second source select line SSL2.

The connection patterns CP1 and CP2 may include a first connection pattern CP1 and a second connection pattern CP2, which are isolated from each other by the source-side slit SS. The first connection pattern CP1 may connect the first source channel SC1 and the first vertical channel VC1 between the first source select line SSL1 and the gate stack structure GST. The second connection pattern CP2 may connect the second source channel SC2 and the second vertical channel VC2 between the second source select line SSL2 and the gate stack structure GST.

The second insulating layer 59 may extend to fill the source-side slit SS. In an embodiment, the second insulating layer 59 may be disposed between the first source select line SSL1 and the second source select line SSL2. Also, the second insulating layer 59 may penetrate the first insulating layer 55 and may extend between the first connection pattern CP1 and the second connection pattern CP2.

The drain select lines DSL1 and DSL2 may include a first drain select line DSL1 and a second drain select line DSL2, which are isolated from each other by a drain-side slit SD. The first drain select line DSL1 may overlap with the first source select line Sal, and surround the first vertical channel VC1. The second drain select line DSL2 may overlap with the second source select line SSL2, and surround the second vertical channel VC2.

Each of the conductive patterns 53 that are used as the word lines WL may surround the first vertical channel VC1 between the first drain select line DSL1 and the first connection pattern CP1, Each of the conductive patterns 53 that are used as the word lines WL may extend between the second drain select line DSL2 and the second connection pattern CP2 to surround the second vertical channel VC2.

The first upper insulating layer 83 may extend to fill the drain-side slit SD. In an embodiment, the first upper insulating layer 83 may penetrate an interlayer insulating layer that is adjacent to the first upper insulating layer 83 among the interlayer insulating layers 51 and may extend between the first drain select line Dal and the second drain select line DSL2. The first vertical channel VC1 and the second vertical channel VC2 may extend to the inside of the first upper insulating layer 83.

The bit line BL may extend in the third direction D3 to overlap with the first connection pattern CP1 and the second connection pattern CP2. The bit line BL may be connected to a pair of first and second vertical channels VC1 and VC2 that correspond to the bit line BL through the contact plugs CT.

Figure 7A:
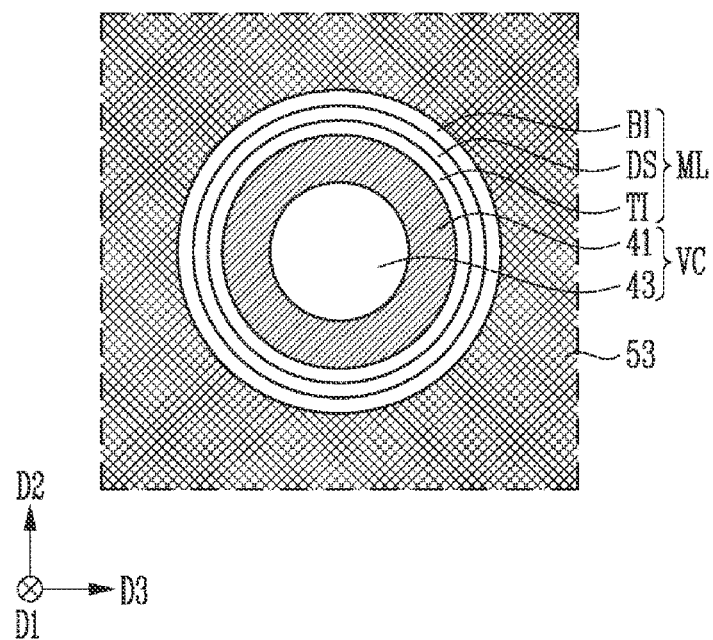
FIGS. 7A to 7B are enlarged views illustrating a cross-section of a vertical channel and a cross-section of a source channel in accordance with an embodiment of the present disclosure.
Figure 7B:
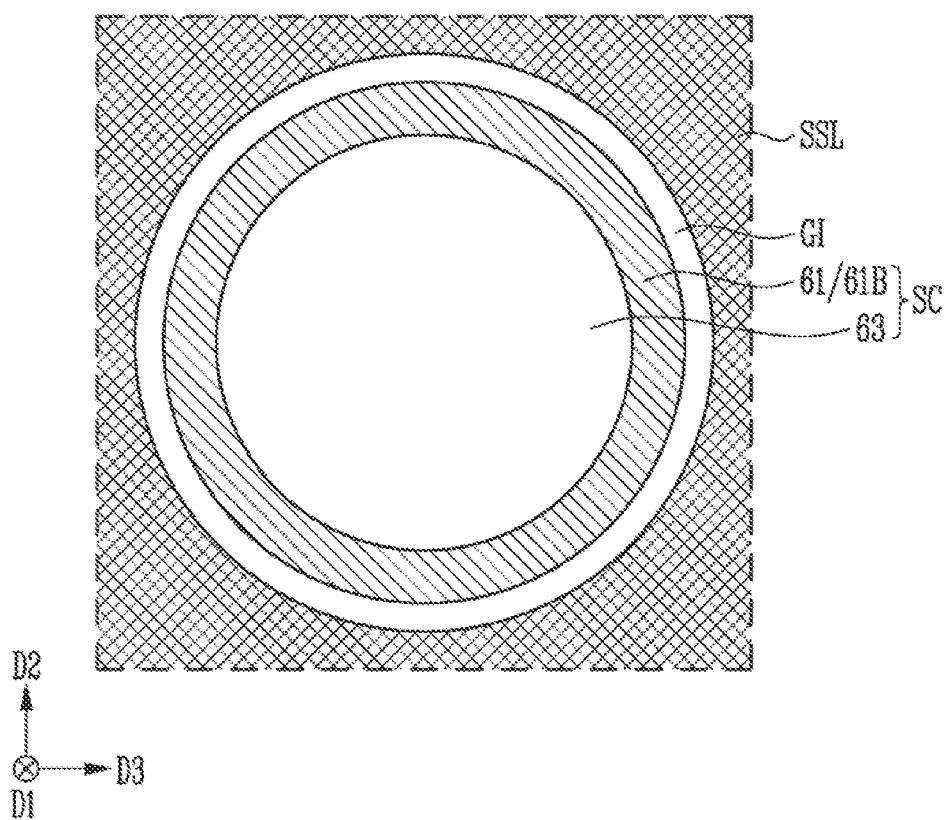

FIGS. 7A to 7B are enlarged views illustrating a cross-section of a vertical channel VC and a cross-section of a source channel SC in accordance with an embodiment of the present disclosure.

Referring to FIG. 7A, the vertical channel VC may be surrounded by a conductive pattern 53 with a memory layer ML interposed between the vertical channel VC and the conductive pattern 53, The memory layer ML may include a tunnel insulating layer TI, a data storage layer DS, and a blocking insulating layer BI.

The tunnel insulating layer TI may extend along a surface of a vertical channel layer 41. The tunnel insulating layer TI may include an insulating material through which charges can tunnel. In an embodiment, the tunnel insulating layer TI may include a silicon oxide layer.

The data storage layer DS may extend along a surface of the tunnel insulating layer TI. The data storage layer DS may include a material layer that is capable of storing data. In an embodiment, the data storage layer DS may include a nitride layer that is capable of storing data changed by using Fowler Nordheim tunneling.

The blocking insulating layer BI may extend along a surface of the data storage layer DS. The blocking insulating layer BI may include an oxide layer.

A vertical core insulating layer 43 of the vertical channel VC may be spaced apart from the memory layer ML by the vertical channel layer 41.

Referring to FIG. 78, a source core insulating layer 63 of the source channel SC may be spaced apart from a source select line SSL by a gate insulating layer GI and a source channel layer 61. The pillar part 61B of the source channel layer 61 may be surrounded by the source select line SSL with the gate insulating layer GI that is interposed between the pillar part 618 and the source select line SSL.

FIGS. 8A, 88, 9A, 98, 10A, 108, 10C, 10D, 10E, 10F, 11, 12A, 12B, and 12C are sectional views illustrating a manufacturing method of a semiconductor memory device in accordance with an embodiment of the present disclosure.

Figure 8A:
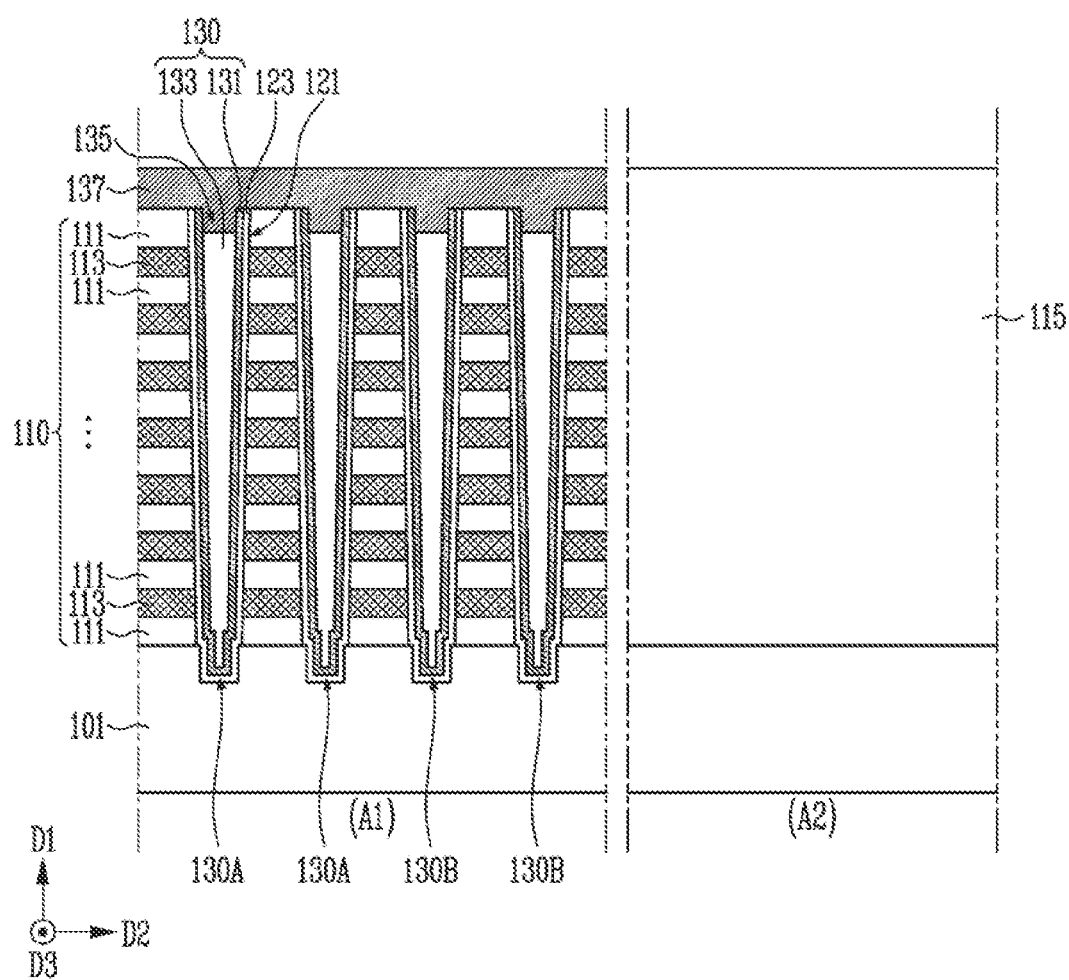
FIGS. 8A, 8B, 9A, 9B, 10A, 10B, 10C, 10D, 10E, 10F, 11, 12A, 12B, and 12C are sectional views illustrating a manufacturing method of a semiconductor memory device in accordance with an embodiment of the present disclosure.
Figure 8B:
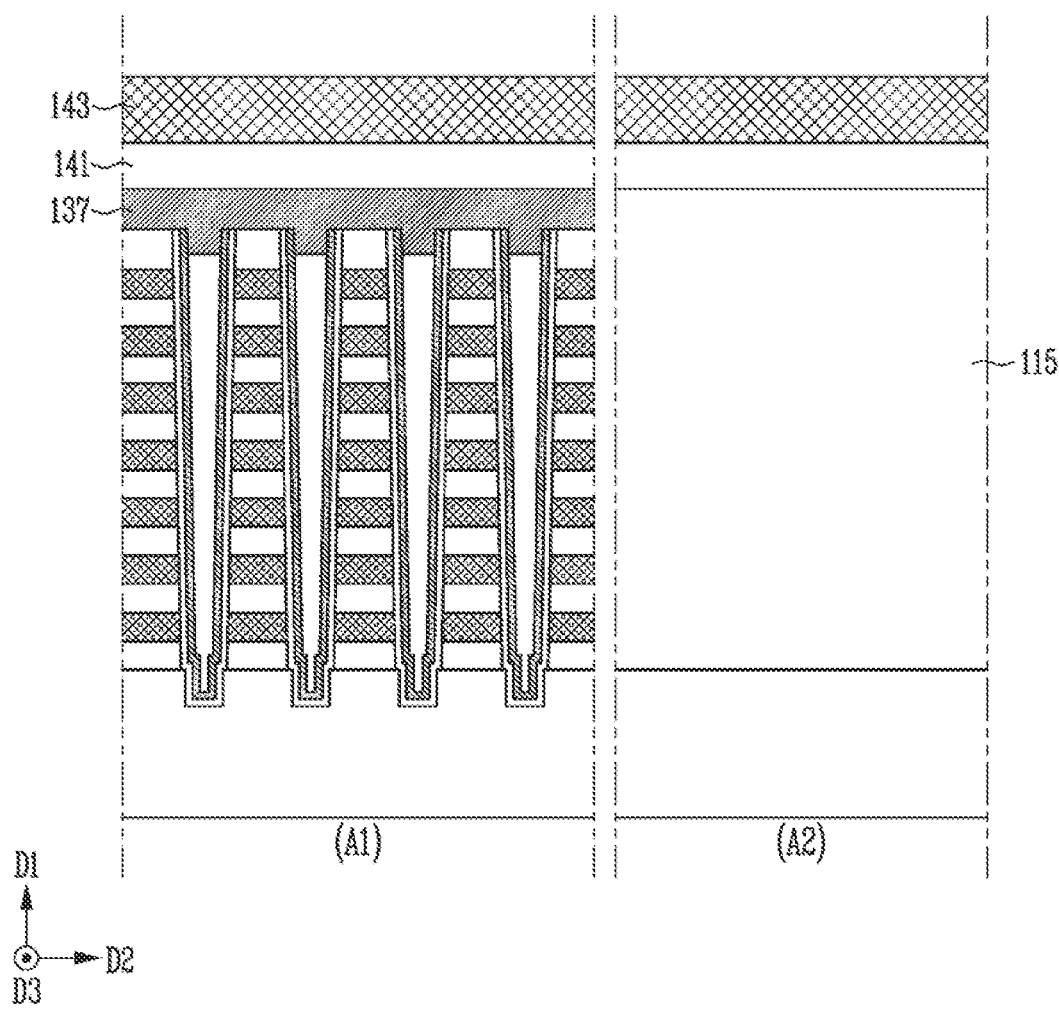

FIGS. 8A and 88 are sectional views illustrating a process of forming a preliminary gate stack structure 110, a conductive layer 137, and a select gate layer 143.

Referring to FIG. 8A, the preliminary gate stack structure 110 that is penetrated by a memory layer 123 and a plurality of vertical channels 130 may be formed on a sacrificial substrate 101 including a first region A1 and a second region A2. The sacrificial substrate 101 may be a silicon substrate.

The preliminary gate stack structure 110 may be formed on the first region A1 of the sacrificial substrate 101. The preliminary gate stack structure 110 may be penetrated by a plurality of vertical channel holes 121 extending in the first direction D1. The plurality of vertical channel holes 121 may extend into the first region A1 of the sacrificial substrate 101.

The memory layer 123 may extend along a surface of each of the vertical channel holes 121. The memory layer 123 may include the blocking insulating layer BI, the data storage layer DS, and the tunnel insulating layer TI, which are shown in FIG. 7A.

Each of the vertical channels 130 may include a vertical channel layer 131 and a vertical core insulating layer 133. The vertical channel layer 131 may extend along a surface of the memory layer 123, and a central region of the vertical channel hole 121 may be opened. The vertical channel layer 131 may include a semiconductor layer. In an embodiment, the vertical channel layer 131 may include an undoped silicon. The vertical core insulating layer 133 may be disposed in the central region of the vertical channel hole 121, which is opened by the vertical channel layer 131.

The preliminary gate stack structure 110 may include interlayer insulating layers 111 and conductive patterns 113, which are alternately stacked on the first region A1 of the sacrificial substrate 101. The interlayer insulating layers 111 and the conductive patterns 113 may surround the plurality of vertical channels 130 with the memory layer 123 that is interposed between the plurality of vertical channels 130 and each of the interlayer insulating layers 111 and the conductive patterns 113. The plurality of vertical channels 130 may include a first vertical channel 130A and a second vertical channel 130B.

Subsequently, the conductive layer 137 that is connected to the plurality of vertical channels 130 may be formed on the preliminary gate stack structure 110. The conductive layer 137 may include a doped semiconductor layer. In an embodiment, the conductive layer 137 may include a doped silicon layer, and the doped silicon layer may include an n-type impurity. The conductive layer 137 may extend toward the central region of each of the vertical channel holes 121.

In an embodiment, the process of forming the conductive layer 137 may include a process of etching a portion of the vertical core insulating layer 133 such that a first recess region 135 is defined in the central region of the vertical channel hole 121, and a process of forming a doped semiconductor layer on the preliminary gate stack structure 110 to fill the first recess region 135, A portion of an inner wall of the vertical channel layer 131 may be exposed by the first recess region 135.

The conductive layer 137 and the preliminary gate stack structure 110 may be patterned to not overlap with the second region A2 of the sacrificial substrate 101. The second region A2 may be a region that extends from the first region A1 of the sacrificial substrate 101. In an example, the second region A2 may extend in the second direction D2 that intersects with the plurality of vertical channels 130 from the first region A1.

Subsequently, a first filling insulating layer 115 may be formed. The first filling insulating layer 115 may cover the second region A2 of the sacrificial substrate 101, which is opened by the conductive layer 137 and the preliminary gate stack structure 110. The first filling insulating layer 115 may extend up to a level at which the conductive layer 137 is disposed.

Referring to FIG. 83, a first insulating layer 141 and the select gate layer 143 may be formed on the conductive layer 137. The first insulating layer 141 and the select gate layer 143 may extend to cover the first filling insulating layer 115. The select gate layer 143 may be formed of various conductive materials.

Figure 9A:
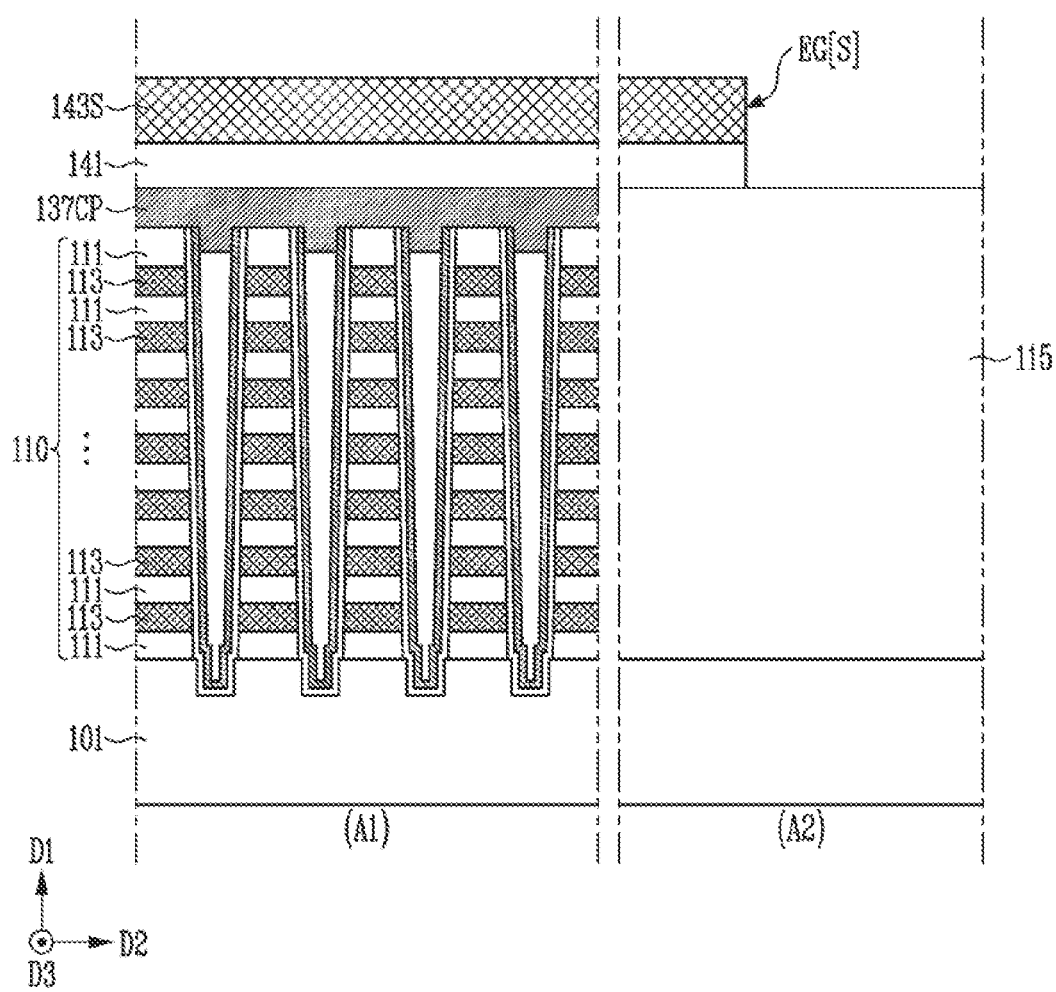

FIGS. 9A and 93 are sectional views illustrating a process of forming source select lines 143S, which is continued after the process described with reference to FIG. 83. FIG. 9A is a sectional view taken along an axis parallel to one of the source select lines 143S. FIG. 93 is a sectional view taken along an axis intersecting the source select lines 143S.

Referring to FIGS. 9A and 93, a source-side slit 145 penetrating the select gate layer 143, the first insulating layer 141, and the conductive layer 137, which are shown in FIG. 83, may be formed by etching the select gate layer 143, the first insulating layer 141, and the conductive layer 137. Accordingly, the select gate layer 143 may be isolated into a plurality of source select lines 143S, and the conductive layer 137 may be isolated into a plurality of connection patterns 137CP.

Figure 9B:
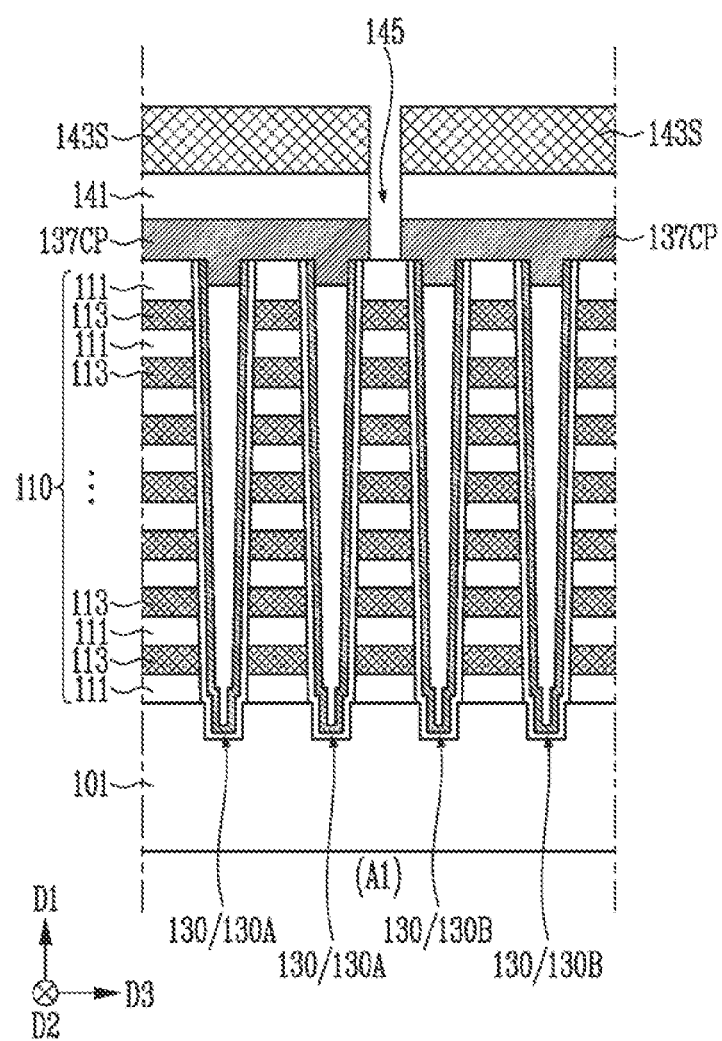

The plurality of source select lines 143S may include a first source select line and a second source select line, and the plurality of connection patterns 137CP nay include a first connection pattern and a second connection pattern. The first connection pattern may be in contact with the first vertical channel 130A, and the second connection pattern may be in contact with the second vertical channel 130B. As shown in FIG. 9B, the first source select line may overlap with the first vertical channel 130A, and the second source select line may overlap with the second vertical channel.

Each source select line 143S may include an end portion EG[S] overlapping with the first filling insulating layer 115.

FIGS. 10A to 10F are sectional views illustrating processes continued after the process described with reference to FIGS. 9A and 9B. Each of FIGS. 10A to 10F is a sectional view taken along an axis parallel to one of the source select lines 143S.

Figure 10A:
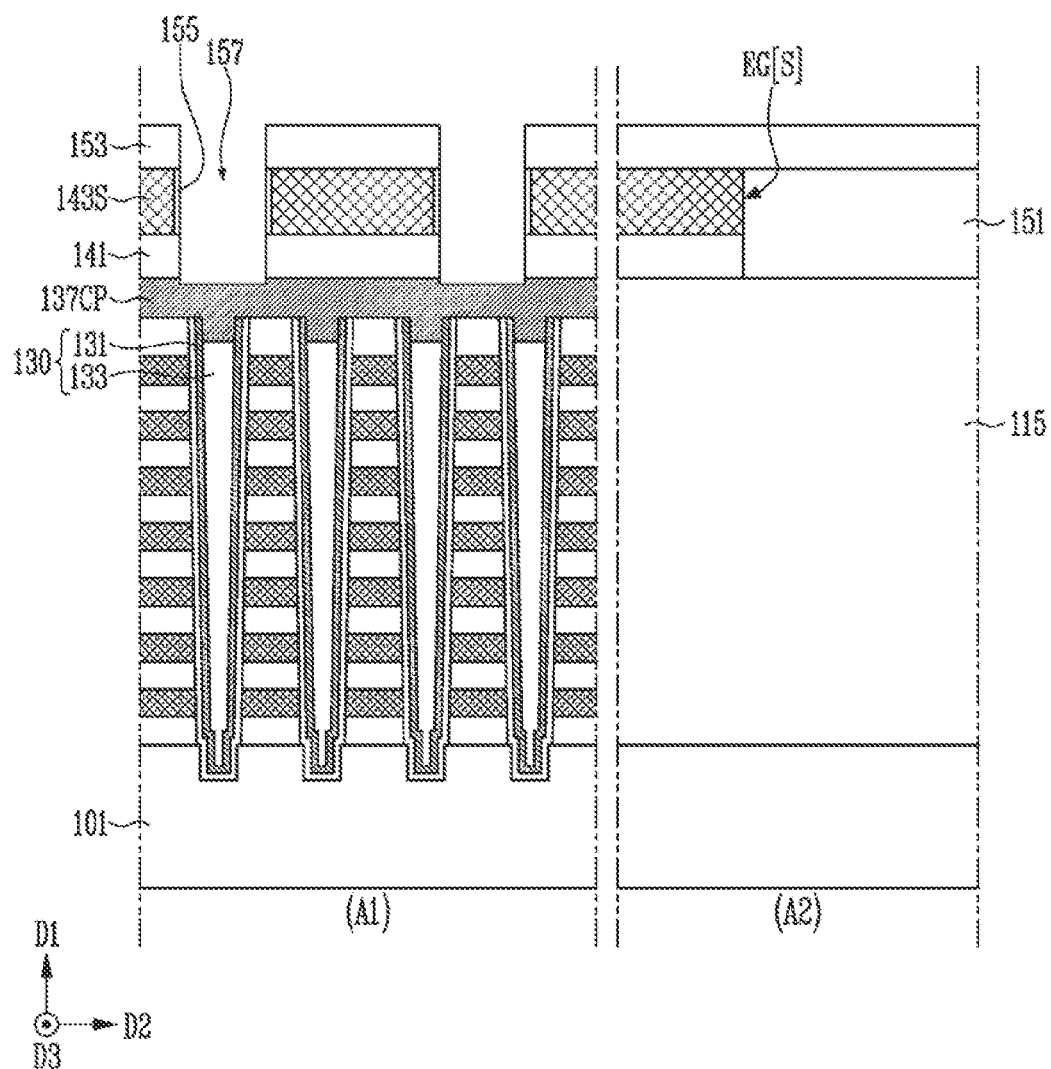

Referring to FIG. 10A, a second filling insulating layer 151 that covers the end portion EG[S] of the source select line 143S may be formed on the first filling insulating layer 115.

Subsequently, a second insulating layer 153 may be formed. The second insulating layer 153 may cover the source select line 143S. The second insulating layer 153 may extend to cover the second filling insulating layer 151.

Subsequently, source channel holes 157 may be formed, The source channel holes 157 may penetrate the second insulating layer 153, the source select line 143S, and the first insulating layer 141 and may expose the connection patterns 137CP. Subsequently, a gate insulating layer 155 may be formed on a sidewall of the source select line 143S, which is exposed through each source channel hole 157.

In an embodiment, the gate insulating layer 155 may be formed through an oxidation process. During the oxidation process of forming the gate insulating layer 155, an oxide layer that is formed on a surface of the connection pattern 137CP may be removed through an etch-back process.

Figure 10B:
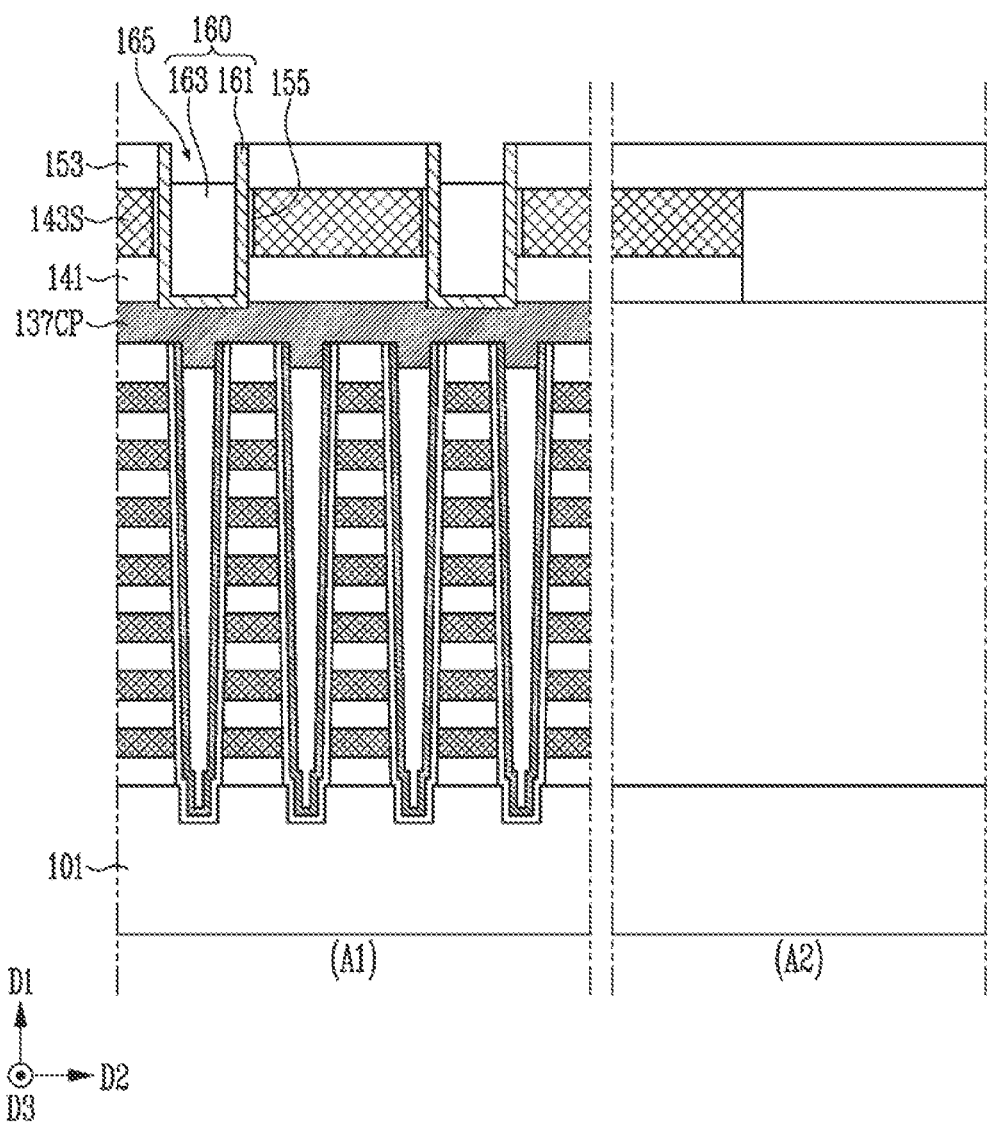

Referring to FIG. 10B, the source channel holes 157 shown in FIG. 10A may be respectively filled with source channels 160. The source channels 160 may be in contact with the connection pattern 137CP.

The process of forming the source channels 160 may include a process of forming an undoped semiconductor layer 161 along a surface of each of the source channel holes 157, shown in FIG. 10A, and a process of forming a source core insulating layer 163 on the undoped semiconductor layer 161. In an embodiment, the undoped semiconductor layer 161 may include undoped silicon. The undoped semiconductor layer 161 may be spaced apart from the source select line 143S by the gate insulating layer 155. The source core insulating layer 163 may fill the central region of each of the source channel holes 157 shown in FIG. 10A.

Subsequently, a portion of the source core insulating layer 163 may be etched such that a second recess region 165 is defined. A portion of an inner wall of the undoped semiconductor layer 161 may be exposed by the second recess region 165.

Figure 10C:
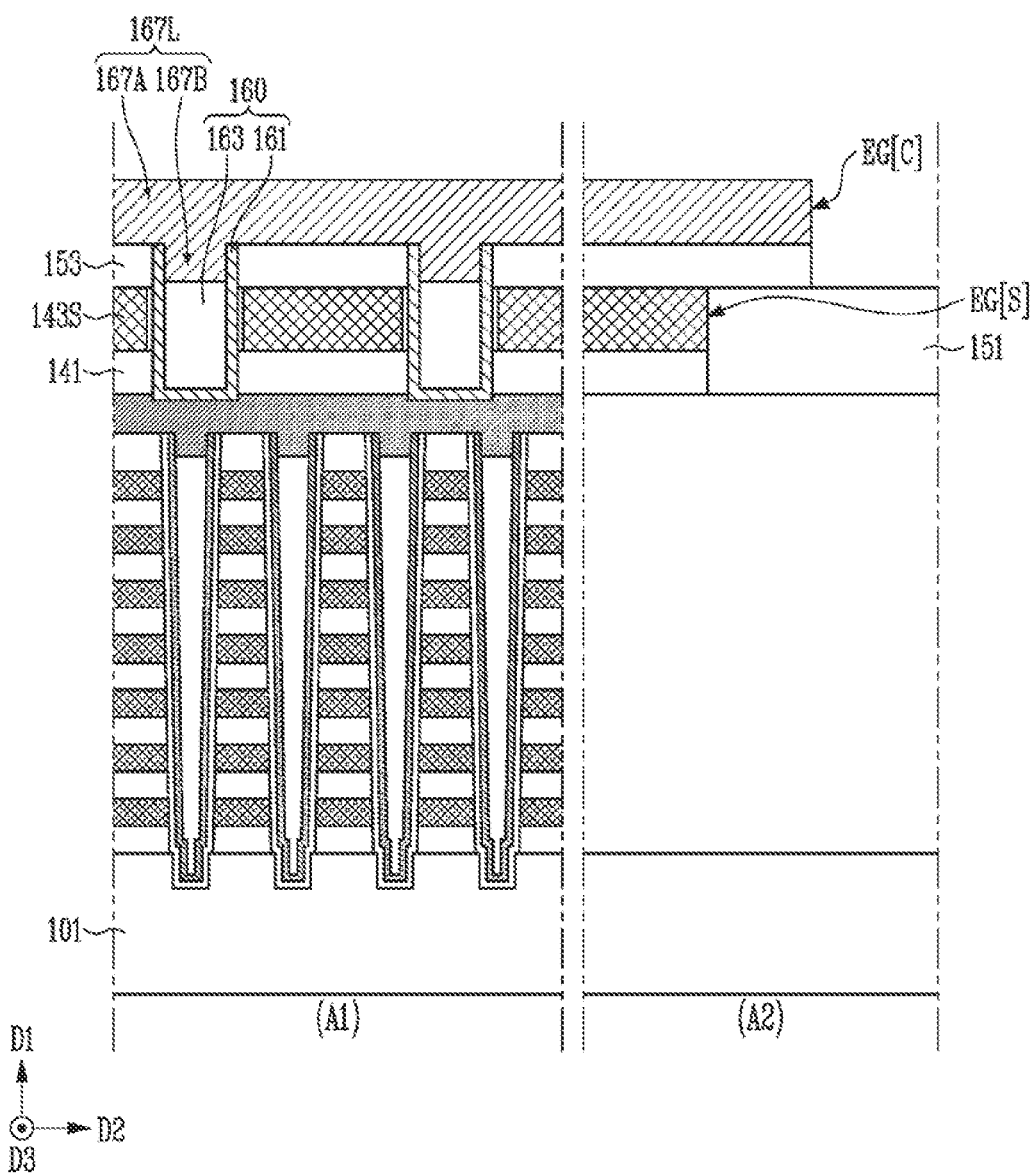

Referring to FIG. 10C, a doped semiconductor layer may be formed on the second insulating layer 153 to fill the second recess region 165 as shown in FIG. 10B. In an embodiment, the doped semiconductor layer may include an n-type impurity and may include a doped silicon layer.

Subsequently, the doped semiconductor layer and the second insulating layer 153 may be etched. Accordingly, the doped semiconductor layer may remain as a common source layer 167L connected to the source channels 160.

The common source layer 167L may include an end portion EG[C] that overlaps with the second filling insulating layer 151. The end portion EG[C] of the common source layer 167L may protrude farther toward the second direction D2 than the end portion EG[S] of the source select line 143S.

The common source layer 167L may include a line part 167A and a protrusion part 167B. The line part 167A may be parallel to the source select line 143S. The protrusion part 167B may extend toward the source core insulating layer 163 from the line part 167A. The second recess region 165, shown in FIG. 10B, may be filled with the protrusion part 1673 that corresponds to the second recess region 165. In addition, the protrusion part 167B that corresponds to the second recess region 165 may be in contact with the inner wall of the undoped semiconductor layer 161.

Figure 10D:
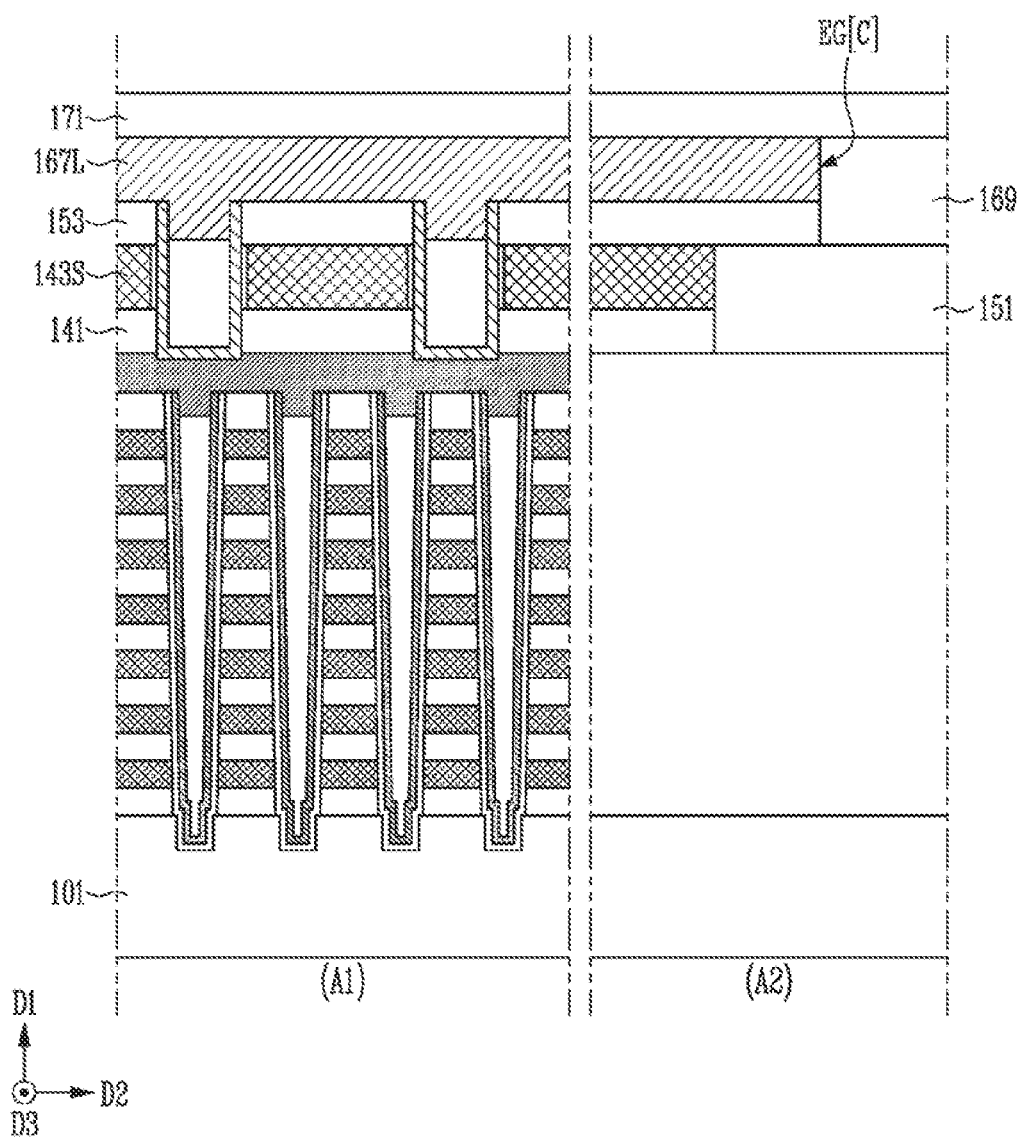

Referring to FIG. 10D, a third filling insulating layer 169 may be formed on the second filling insulating layer 151. The third filling insulating layer 169 may cover the end portion EG[C] of the common source layer 167L.

Subsequently, a first bonding insulating layer 171 may be formed. The first bonding insulating layer 171 may cover the common source layer 167L. The first bonding insulating layer 171 may extend to cover the third filling insulating layer 169.

Figure 10E:
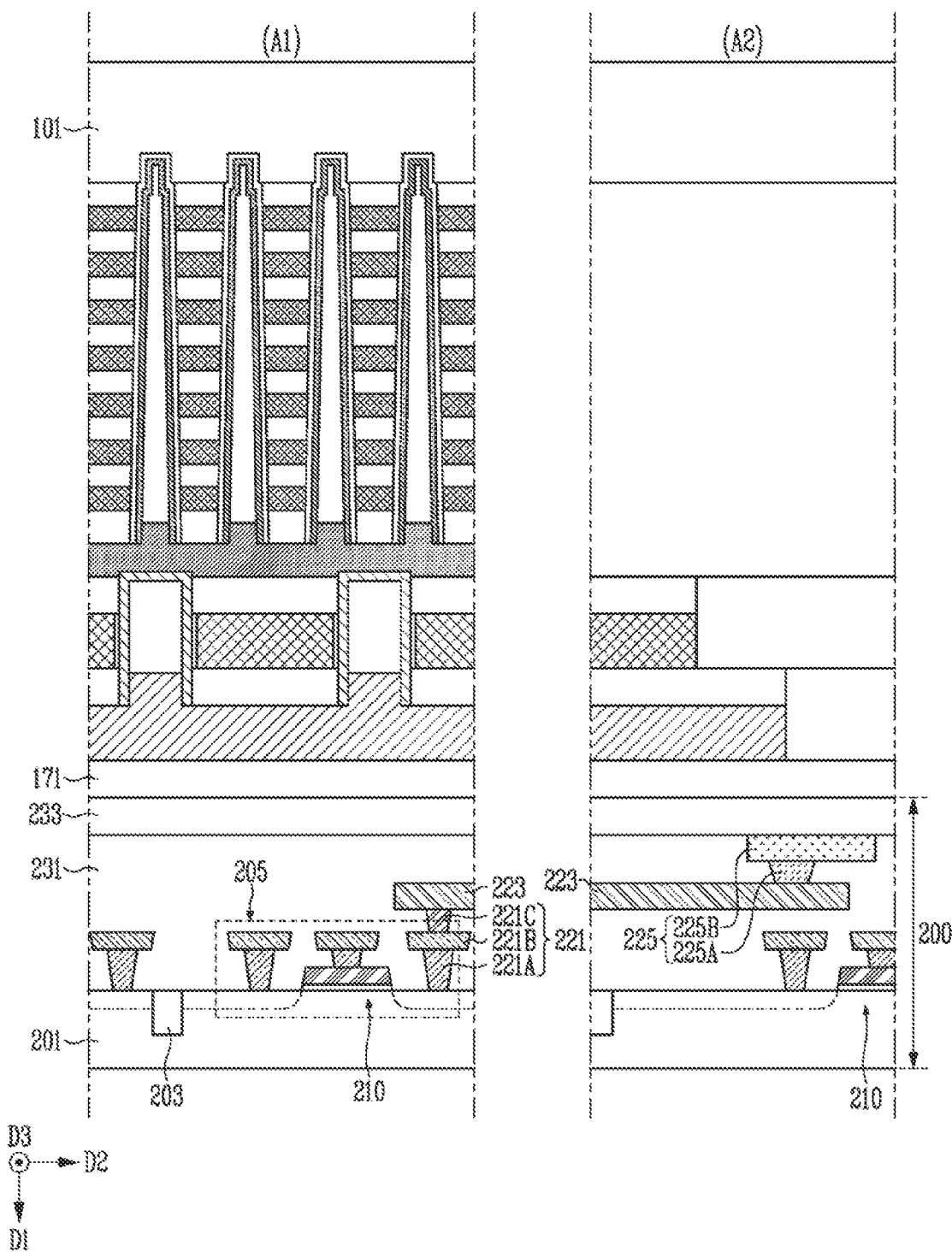

Referring to FIG. 10E, a peripheral circuit structure 200 that is formed through a separate process may be provided. As described with reference to FIGS. 6A and 68, the peripheral circuit structure 200 may include a substrate 201 with a plurality of transistors 210, an insulating structure 231 that covers the substrate 201, a plurality of interconnection structures that is buried in the insulating structure 231, and a second bonding insulating layer 233 that covers the plurality of interconnection structures and the insulating structure 231.

The transistors 210 may be insulated from each other by isolation layers 203 that are formed in the substrate 201. At least one of the transistors 210 may be included in a source control circuit 205. The interconnection structure that is connected to the source control circuit 205 may include a lower contact structure 221, an upper contact structure 225, and an interconnection line 223. The lower contact structure 221 may be connected to the transistor 210 of the source control circuit 205. The upper contact structure 225 might not overlap with the transistor 210 of the source control circuit 250. The interconnection line 223 may connect the lower contact structure 221 and the upper contact structure 225. The lower contact structure 225 may include patterns 221A, 221B and 221C that are sequentially stacked between the transistor 210 of the source control circuit 205 and the interconnection line 223. The transistor 210 of the source control circuit 205 may be connected to the interconnection line 223 by the lower contact structure 221. The interconnection line 223 may extend in the second direction D2 toward the upper contact structure 225. The upper contact structure 225 may include a via plug 225A and a pad pattern 225B, The via plug 225A may be in contact with the interconnection line 223. The pad pattern 225B may be disposed on the via plug 225A.

The sacrificial substrate 101 may overlap with the peripheral circuit structure 200 such that the first bonding insulating layer 171 faces the second bonding insulating layer 233 of the peripheral circuit structure 200. Subsequently, a process of bonding the first bonding insulating layer 171 and the second bonding insulating layer 233 to each other may be formed.

Figure 10F:
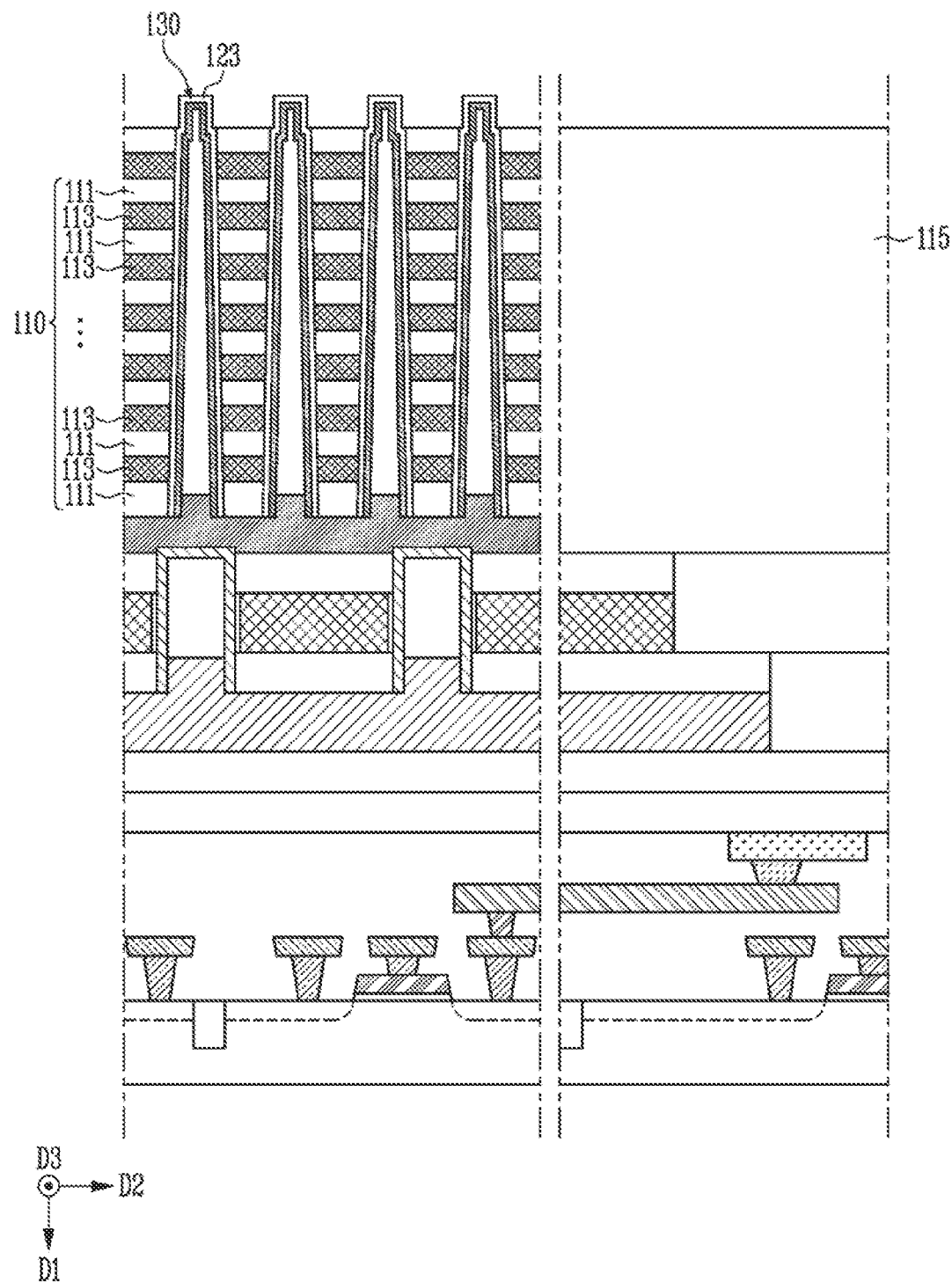

Referring to FIG. 10F, the sacrificial substrate 101 shown in FIG. 10E may be removed. Accordingly, the memory layer 123 that penetrates the preliminary gate stack structure 110 may be exposed. Subsequently, a conductivity type impurity may be injected into an end portion of each of the vertical channels 130. In an embodiment, an n-type impurity may be injected into the end portion of the vertical channels 130.

Figure 11:
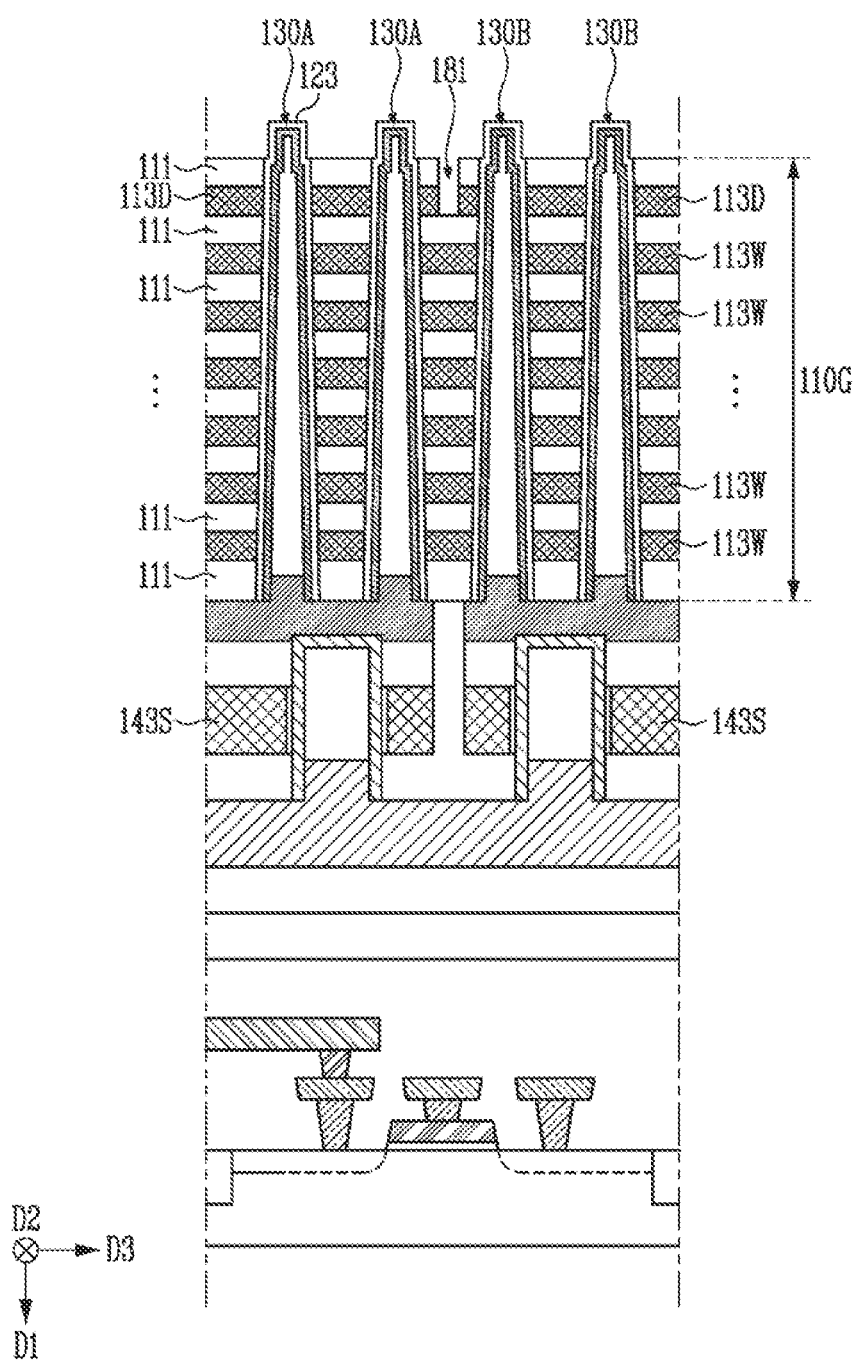

FIG. 11 is a sectional view illustrating a process of forming drain select lines 113D, which is continued after the process described with reference to FIG. 10F, FIG. 11 is a sectional view taken along an axis intersecting the source select lines 143S.

Referring to FIG. 11, a drain-side slit 181 may be formed. The drain-side slit 181 may penetrate a portion of the preliminary gate stack structure 110, shown in FIG. 10F, such that at least one conductive pattern among the conductive patterns 113 of the preliminary gate stack structure 110, shown in FIG. 10F, is isolated into the drain select lines 113D. The drain select lines 113D may respectively overlap with the source select lines 143S. Accordingly, a gate stack structure 110G may be defined.

The drain-side slit 181 may extend to penetrate at least one conductive pattern among the conductive patterns 113 of the preliminary gate stack structure 110 as shown in FIG. 10F.

Conductive patterns that are stacked between the drain au select lines 113D and the source select lines 143S to be spaced apart from each other are not penetrated by the drain-side slit 181, but may remain as word lines 113W. The drain select lines 113D may include a first drain select line that surrounds the first vertical channel 130A and a second drain select line that surrounds the second vertical channel 130B.

Figure 12A:
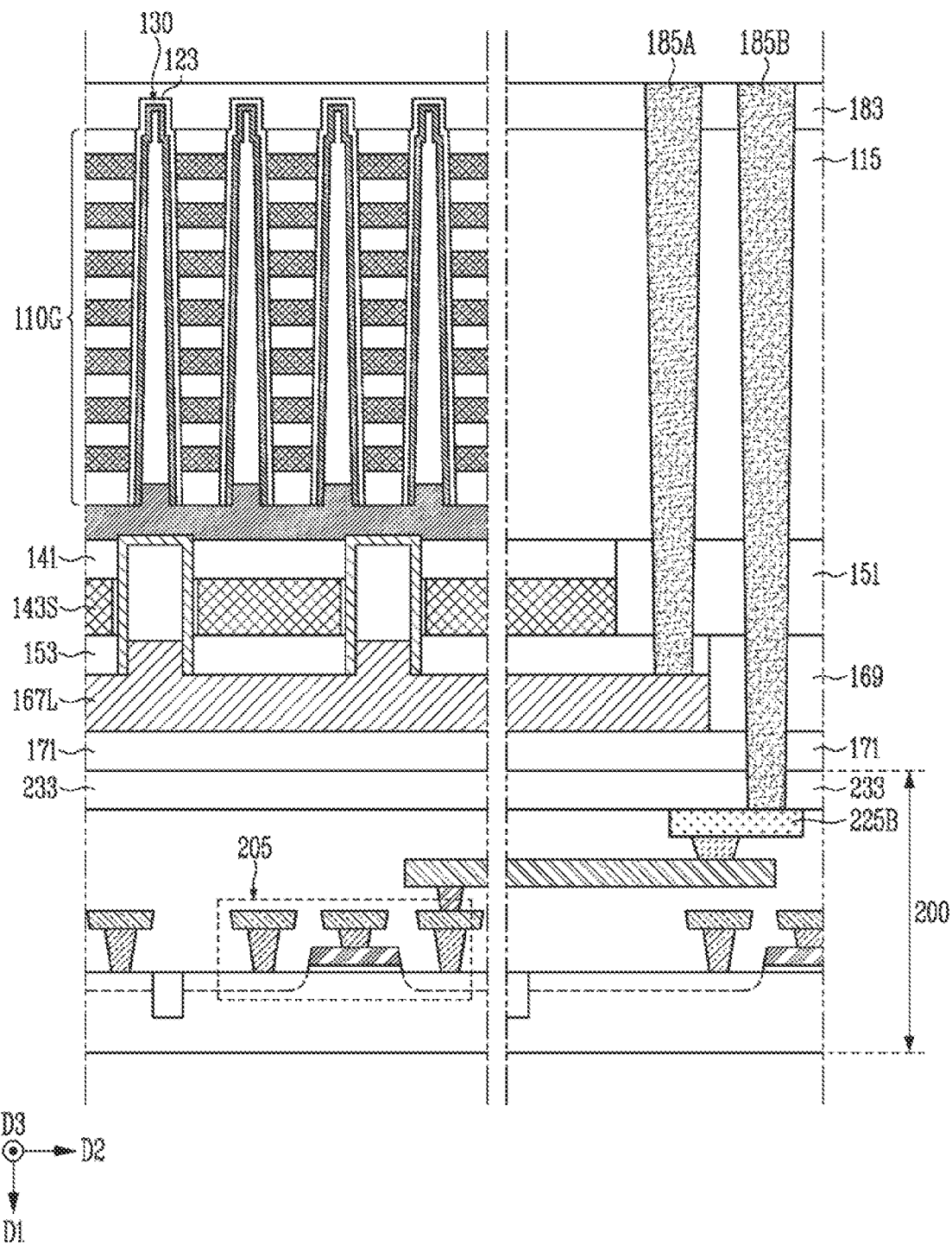
Figure 12B:
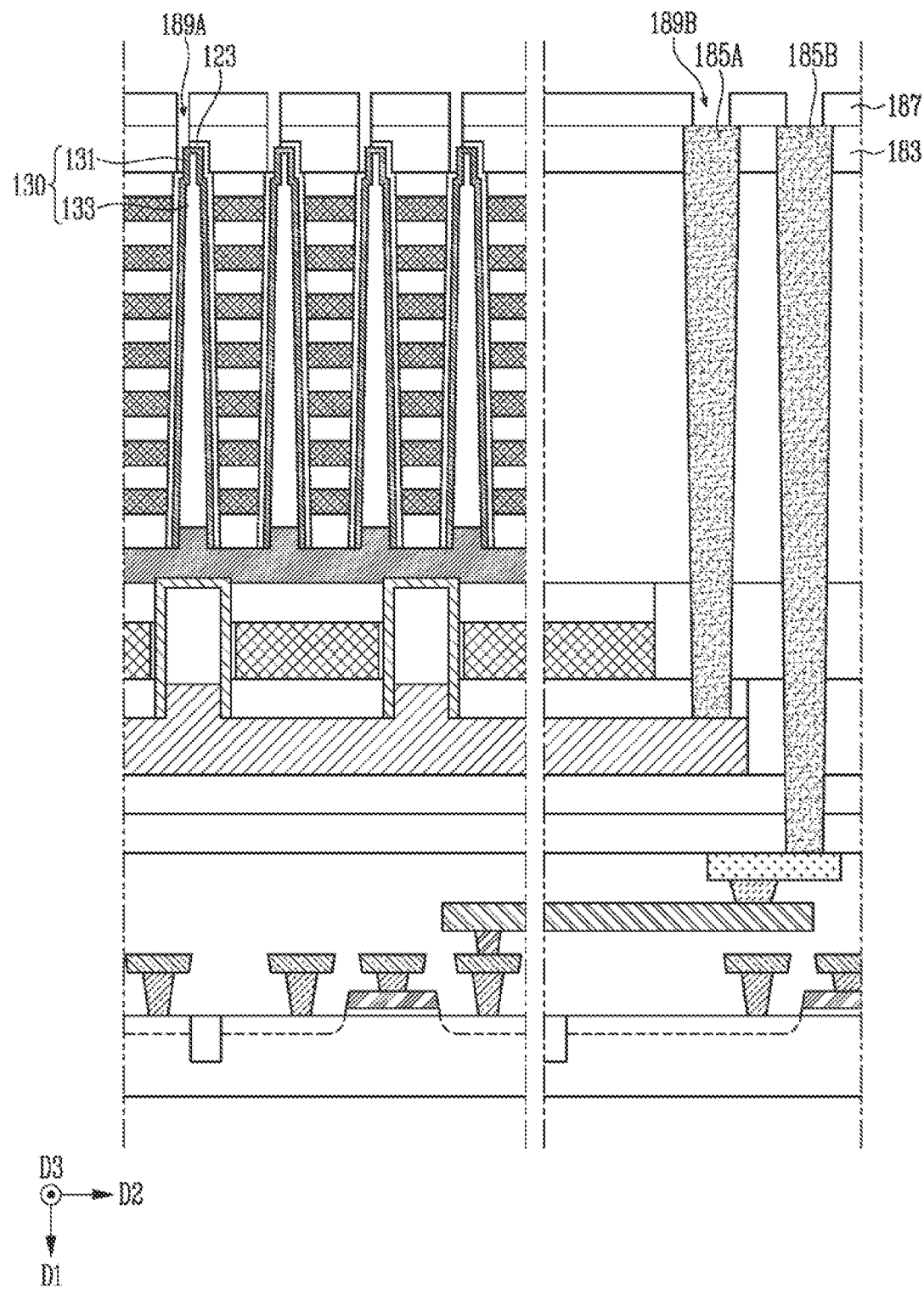
Figure 12C:
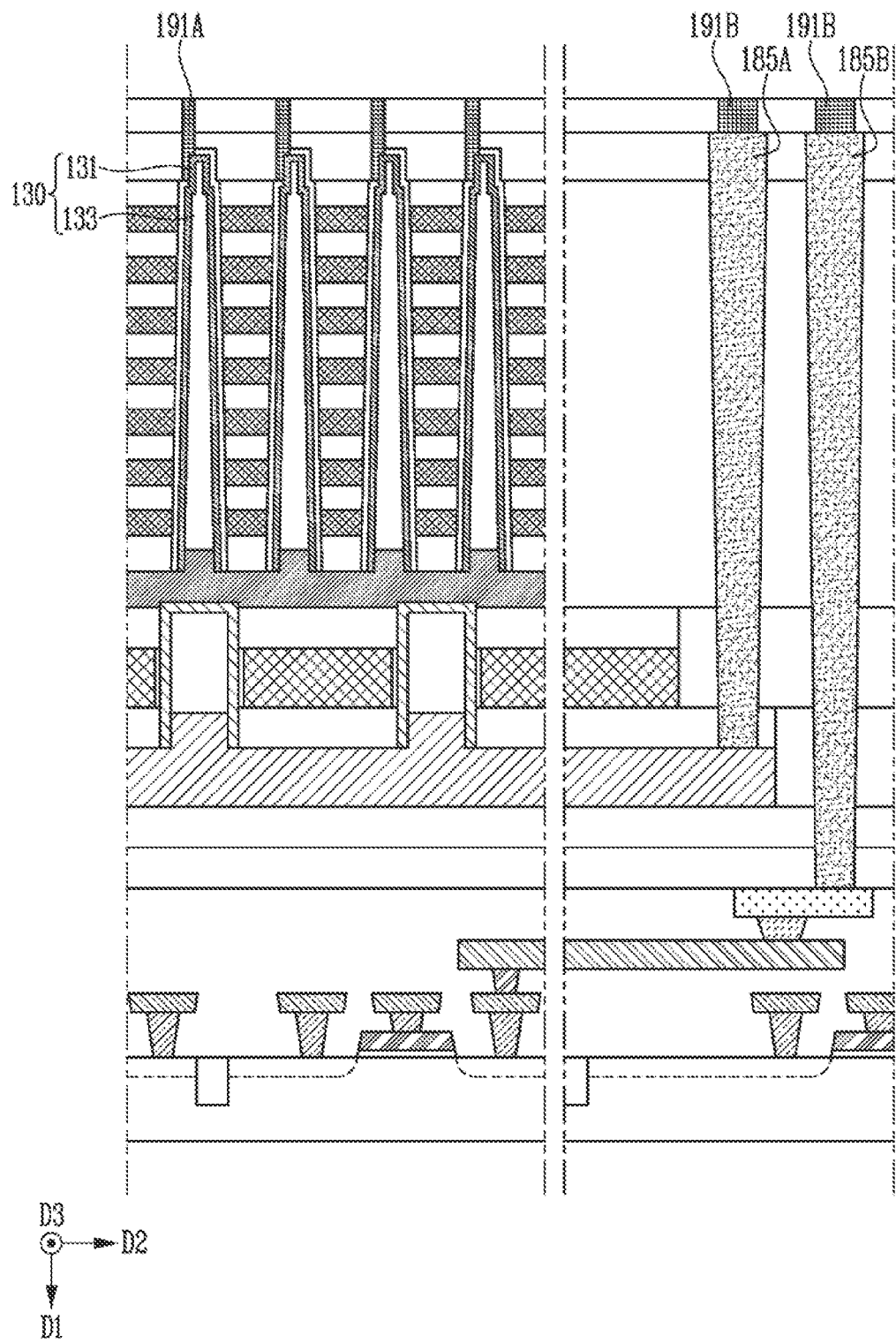

FIGS. 12A to 12C are sectional views illustrating an embodiment of processes continued after the process described with reference to FIG. 11 is performed. Each of FIGS. 12A to 12C is a sectional view taken along an axis parallel to one of the source select lines 143S.

Referring to FIG. 12A, a first upper insulating layer 183 may be formed. The first upper insulating layer may cover the gate stack structure 110G and the memory layer 123. The first upper insulating layer 183 may extend to overlap with the peripheral circuit structure 200 with the first filling insulating layer 115, the second filling insulating layer 151, and the third filling insulating layer 169 being interposed between the first upper insulating layer 183 and the peripheral circuit structure 200.

Subsequently, vertical contact plugs 185A and 185B may be formed. The vertical contact plugs 185A and 185B may penetrate the first upper insulating layer 183, the first filling insulating layer 115, and the second filling insulating layer 151. The vertical contact plugs 185A and 185B may include a first vertical contact plug 185A and a second vertical contact plug 185B.

The first vertical contact plug 185A may extend toward the common source layer 167L. The first vertical contact plug 185A may extend to penetrate the second insulating layer 153 that is disposed between the common source layer 167L and the second filling insulating layer 151, The first vertical contact plug 185A may be in contact with the common source layer 167L. The second vertical contact plug 185B may extend toward the pad pattern 225B that is connected to the source control circuit 205, The second vertical contact plug 185B may extend to penetrate the third filling insulating layer 169, the first bonding insulating layer 171, and the second bonding insulating layer 233, which are disposed between the pad pattern 225B and the second filling insulating layer 151. The second vertical contact plug 185B may be in contact with the pad pattern 225B.

Referring to FIG. 12B, a second upper insulating layer 187 may be formed on the first upper insulating layer 183. The second upper insulating layer 187 may extend to cover the first and second vertical contact plugs 185A and 185B.

Subsequently, contact holes 189A and 189B may be formed. The contact holes 189A and 189B may penetrate the second upper insulating layer 187. The contact holes 189A and 189B may include first contact holes 189A and second contact holes 189B.

The first contact holes 189A may respectively extend toward the vertical channels 130. Each of the first contact holes 189A may extend to penetrate the first upper insulating layer 183 and the memory layer 123, which are disposed between the vertical channel layer 131 and the second upper insulating layer 187. The vertical channel layer 131 may be exposed by the first contact hole 189A.

The second contact holes 189B may be formed to expose the first vertical contact plug 185A and the second vertical contact plug 185B.

Referring to FIG. 12C, each of the first contact holes 189A and the second contact holes 189B, which are shown in FIG. 12A, may be filled with a conductive material. Accordingly, contact plugs 191A and via plugs 191B may be formed.

Each of the contact plugs 191A may be disposed in the first contact hole 189A shown in FIG. 12A and may be in contact with the channel layer 131 of the vertical channel 130. The via plugs 191B may be disposed in the second contact holes 189B shown in FIG. 12A and may be respectively in contact with the first vertical contact plug 185A and the second vertical contact plug 185B.

Subsequently, a subsequent process of forming bit lines and upper conductive patterns may be continued.

Figure 13:
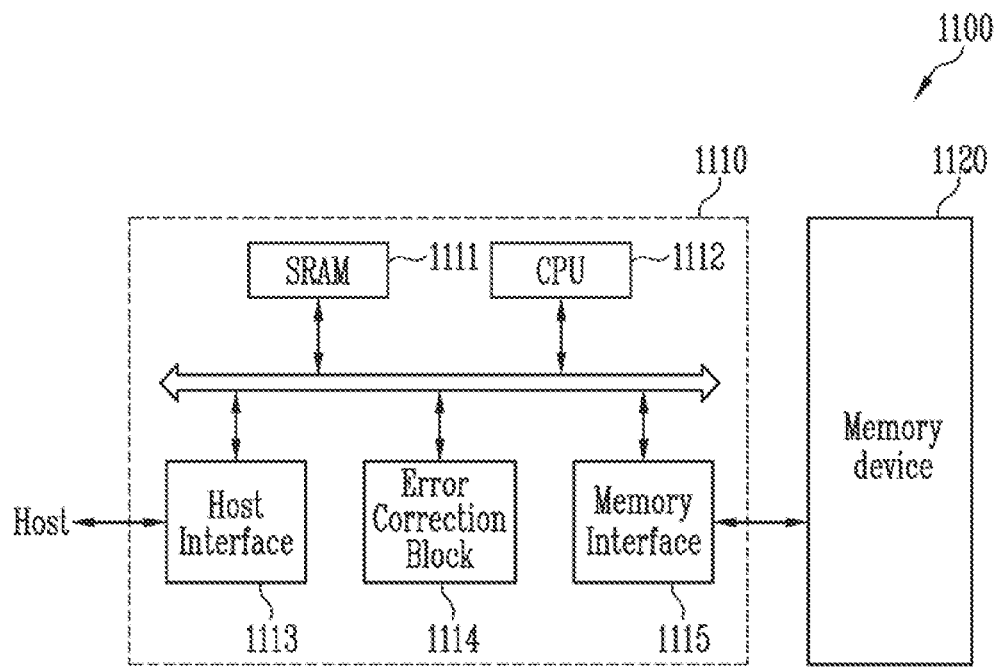
FIG. 13 is a block diagram illustrating a configuration of a memory system in accordance with an embodiment of the present disclosure.

FIG. 13 is a block diagram illustrating a configuration of a memory system 1100 in accordance with an embodiment of the present disclosure.

Referring to FIG. 13, the memory system 1100 includes a memory device 1120 and a memory controller 1110.

The memory device 1120 may include a source channel penetrating a source select line, a gate stack structure overlapping with the source select line, a connection pattern disposed between the source select line and the gate stack structure, and a vertical channel that is connected to the source channel through the connection pattern and penetrates the gate stack structure.

The memory device 1120 may be a multi-chip package configured with a plurality of flash memory chips.

The memory controller 1110 may control the memory device 1120 and may include a Static Random Access Memory (SRAM) 1111, a Central Processing Unit (CPU) 1112, a host interface 1113, an error correction block 1114, and a memory interface 1115. The SRAM 1111 is used as an operation memory of the CPU 1112, the CPU 1112 performs overall control operations for data exchange of the memory controller 1110, and the host interface 1113 includes a data exchange protocol for a host connected with the memory system 1100. The error correction block 1114 detects and corrects an error included in a data read from the memory device 1120. The memory interface 1115 interfaces with the memory device 1120. The memory controller 1110 may further include a Read Only Memory (ROM) for storing code data for interfacing with the host, and the like, FIG. 14 is a block diagram illustrating a configuration of a computing system 1200 in accordance with an embodiment of the present disclosure.

Figure 14:
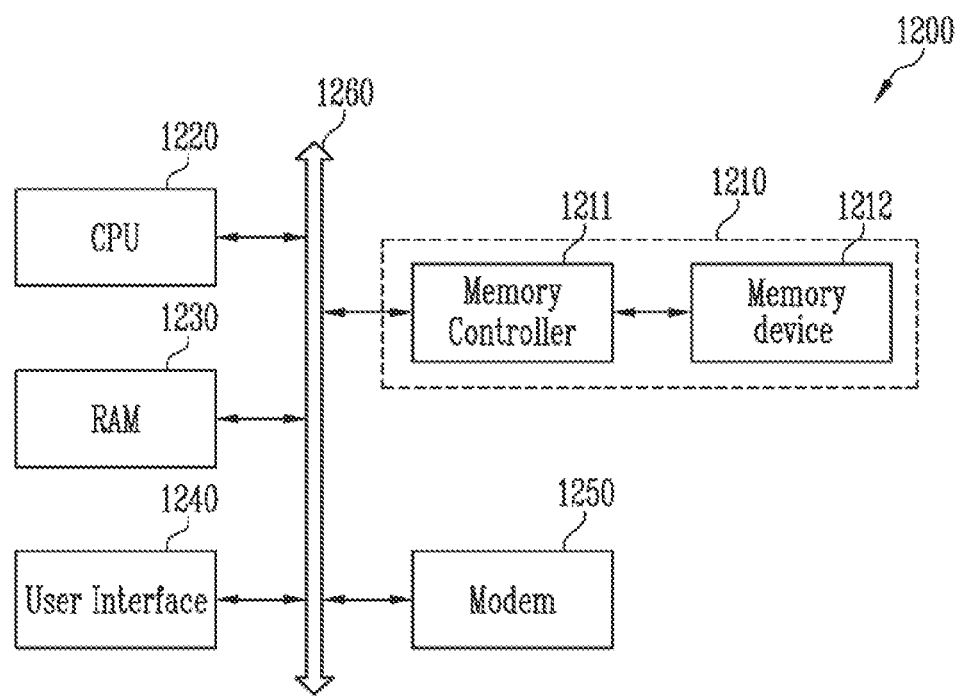
FIG. 14 is a block diagram illustrating a configuration of a computing system in accordance with an embodiment of the present disclosure.

Referring to FIG. 14, the computing system 1200 may include a CPU 1220, a random access memory (RAM) 1230, a user interface 1240, a modem 1250, and a memory system 1210, which are electrically connected to a system bus 1260. The computing system 1200 may be a mobile device.

The memory system 1210 may include a memory device 1212 and a memory controller 1211. The memory device 1212 may include a source channel that penetrates a source select line, a gate stack structure that overlaps with the source select line, a connection pattern that is disposed between the source select line and the gate stack structure, and a vertical channel that is connected to the source channel through the connection pattern and penetrates the gate stack structure.

In accordance with the present disclosure, a vertical channel that penetrates a gate stack structure and a source channel that penetrates a source select line may be connected to each other through a connection pattern that is disposed between the gate stack structure and the source select line. Accordingly, a process load for securing an alignment margin between the vertical channel and the source channel may be reduced.

In accordance with the present disclosure, source channels may be aligned on the connection pattern extending in parallel to the gate stack structure. Accordingly, the stability of a process of aligning the source channels on the connection pattern may be improved, and the degree of arrangement freedom of the source channels may be improved.

In accordance with the present disclosure, memory cell strings may be divided into simultaneously individually selectable groups Li) for each of source select lines that are isolated from each other by a source-side slit. Accordingly, read disturb may be reduced, and thus, the operational reliability of the semiconductor memory device may be improved.

What is claimed is:

1. A semiconductor memory device comprising:
a source select line including a plurality of source channel holes;
a plurality of source channels respectively disposed in the plurality of source channel holes;
a gate stack structure overlapping with the source select line and including a plurality of vertical channel holes;
a connection pattern disposed between the source select line and the gate stack structure, the connection pattern being commonly connected to the plurality of source channels; and
a plurality of vertical channels respectively disposed in the plurality of vertical channel holes, the plurality of vertical channels being commonly connected to the connection pattern,
wherein the connection pattern extends to overlap with a portion of the source select line between the plurality of source channels and to overlap with a portion of the gate stack structure between the plurality of vertical channels,
wherein the plurality of vertical channels and the plurality of source channels are in contact with the connection pattern without an insulating layer between the connection pattern and each of the plurality of vertical channels and the plurality of source channels, and
wherein the plurality of source channel holes and the plurality of vertical channel holes do not penetrate the connection pattern so that the connection pattern is continuous in areas overlapping the plurality of source channel holes and the plurality of vertical channel holes.

2. The semiconductor memory device of claim 1,
wherein an area of a cross-section of each of the source channels is wider than an area of a cross-section of each of the vertical channels.

3. The semiconductor memory device of claim 1,
wherein there is at least one instance in which one source channel among the plurality of source channels overlaps with two or more vertical channels among the plurality of vertical channels.

4. The semiconductor memory device of claim 1,
wherein at least one vertical channel among the plurality of vertical channels does not overlap with the plurality of source channels.

5. The semiconductor memory device of claim 1,
wherein a number of the source channels that are connected to the connection pattern is smaller than a number of the vertical channels that are connected to the connection pattern.

6. The semiconductor memory device of claim 1, further comprising:
a common source layer commonly connected to the plurality of source channels, the common source layer overlapping with the connection pattern, the plurality of source channels being interposed between the common source layer and the connection pattern; and
bit lines respectively connected to the vertical channels, the bit lines overlapping with the connection pattern, the plurality of vertical channels being interposed between the bit lines and the connection pattern.

7. The semiconductor memory device of claim 1,
wherein the gate stack structure includes interlayer insulating layers and conductive patterns, which are alternately stacked in a direction in which the plurality of vertical channels extend, and wherein the conductive patterns include:
a drain select line overlapping with the source select line; and
a word line disposed between the drain select line and the source select line.

8. The semiconductor memory device of claim 1, further comprising:
a common source layer commonly connected to the plurality of source channels;
a substrate overlapping with the gate stack structure, the common source layer being interposed between the substrate and the gate stack structure, the substrate including transistors; and
a bonding structure disposed between the substrate and the common source layer.

9. The semiconductor memory device of claim 1, further comprising a common source layer commonly connected to the plurality of source channels,
wherein the common source layer includes a contact region protruding farther than the source select line in a direction that intersects with the plurality of vertical channels.

10. The semiconductor memory device of claim 9, further comprising:
a first vertical contact plug in contact with the contact region of the common source layer, the first vertical contact plug extending in a direction in which the plurality of vertical channels extend;
a source control circuit overlapping with the gate stack structure, the common source layer that is interposed between the source control circuit and the gate stack structure, the source control circuit including a transistor;
an interconnection structure connected to the source control circuit;
a second vertical contact plug connected to the interconnection structure, the second vertical contact plug extending in parallel to the first vertical contact plug; and
an upper conductive pattern connecting the first vertical contact plug and the second vertical contact plug.

11. The semiconductor memory device of claim 1, further comprising a common source layer commonly connected to the plurality of source channels, wherein each of the source channels includes:
a semiconductor layer including a contact pattern connected to the connection pattern and a pillar part, extending toward the common source layer from an edge of the contact pattern; and
a source core insulating layer surrounded by the pillar part of the semiconductor layer between the contact pattern of the semiconductor layer and the common source layer.

12. The semiconductor memory device of claim 11,
wherein the pillar part of each of the source channels includes an undoped region that is defined at a level between the contact pattern and the common source layer.

13. The semiconductor memory device of claim 11,
wherein the common source layer includes a doped semiconductor layer, and
wherein the doped semiconductor layer of the common source layer includes:

a line part extending in parallel to the source select line; and
a protrusion part surrounded by the pillar part of the semiconductor layer between the line part and the source core insulating layer.

14. The semiconductor memory device of claim 1, wherein each of the vertical channels includes:
a vertical core insulating layer with a first surface that faces the connection pattern and a second surface that faces a direction opposite to that of the first surface, the vertical core insulating layer penetrating the gate stack structure; and
a semiconductor layer extending along the second surface of the vertical core insulating layer, the semiconductor layer extending between the gate stack structure and the vertical core insulating layer.

15. The semiconductor memory device of claim 14,
wherein the connection pattern includes a doped semiconductor layer, and
wherein the doped semiconductor layer includes:
a line part extending in parallel to the source select line; and
a protrusion part extending toward the vertical core insulating layer from the line part, the protrusion part being surrounded by the semiconductor layer.

16. A semiconductor memory device comprising:
a first source channel and a second source channel, extending in parallel to each other;
a first source select line surrounding the first source channel;
a second source select line surrounding the second source channel;
a gate stack structure overlapping with the first source select line, the gate stack structure extending to overlap with the second source select line, wherein a first region of the gate stack structure overlapping the first source select line includes a first vertical channel hole and a second region of the gate stack structure overlapping the second source select line includes a second vertical channel hole;
a first vertical channel disposed in the first vertical channel hole;
a second vertical channel disposed in the second vertical channel hole;
a first connection pattern being in contact with the first source channel and the first vertical channel without an insulating layer between the first connection pattern and each of the first source channel and the first vertical channel, wherein the first connection pattern extends between the first source select line and the gate stack structure and extends to overlap with the first vertical channel and the first source channel;
a second connection pattern being in contact with the second source channel and the second vertical channel without an insulating layer between the second connection pattern and each of the second source channel and the second vertical channel, wherein the second connection pattern extends between the second source select line and the gate stack structure and extends to overlap with the second vertical channel and the second source channel; and
a source-side slit disposed between the first source select line and the second source select line, the source-side slit extending between the first connection pattern and the second connection pattern,
wherein the first vertical channel hole and the second vertical channel hole do not penetrate the first connection pattern and the second connection pattern so that the first connection pattern is continuous in an area overlapping the first vertical channel hole and the second connection pattern is continuous in an area overlapping the second vertical channel hole.

17. The semiconductor memory device of claim 16, further comprising a common source layer overlapping with the gate stack structure with the first source select line and the second source select line, which are interposed between the common source layer and the gate stack structure, the common source layer being connected to the first source channel and the second source channel.

18. The semiconductor memory device of claim 16, further comprising a bit line overlapping with the first connection pattern and the second connection pattern, the gate stack structure being interposed between the bit line and the first and second connection patterns, the bit line being connected to the first vertical channel and the second vertical channel.

19. The semiconductor memory device of claim 16, wherein the gate stack structure includes interlayer insulating layers and conductive patterns, which are alternately stacked in a direction in which the first and second vertical channels extend, and
wherein the conductive patterns include:
a first drain select line overlapping with the first connection pattern, the first drain select line surrounding the first vertical channel;
a second drain select line overlapping with the second connection pattern, the second drain select line surrounding the second vertical channel; and
a word line surrounding the first vertical channel between the first drain select line and the first connection pattern, the word line extending between the second drain select line and the second connection pattern to surround the second vertical channel.

20. The semiconductor memory device of claim 19, further comprising a wave-shaped slit extending in a direction that intersects with the first vertical channel and the second vertical channel between the first drain select line and the second drain select line, the wave-shaped slit overlapping with the word line.

21. The semiconductor memory device of claim 19, further comprising:
a drain-side slit extending in a direction that intersects with the first vertical channel and the second vertical channel between the first drain select line and the second drain select line; and
a dummy channel overlapping with the drain-side slit, the dummy channel penetrating the word line.

22. A semiconductor memory device comprising:
a plurality of source channels penetrating a source select line and extending in a first direction;
a gate stack structure overlapping with the source select line in the first direction and including a plurality of vertical channel holes extending in the first direction;
a plurality of vertical channels respectively in the plurality of vertical channel holes and extending in the first direction; and
a connection pattern disposed between the source select line and the gate stack structure to connect the plurality of vertical channels to the plurality of source channels,
wherein the connection pattern is directly connected to the plurality of vertical channels and the plurality of source channels and extends in a second direction crossing the first direction to overlap with a plurality of core regions of the plurality of vertical channels and a plurality of core regions of the plurality of source channels, and
wherein the plurality of vertical channel holes do not penetrate the connection pattern so that the connection pattern is continuous in areas overlapping the plurality vertical channel holes.

\* \* \* \* \*